(12) United States Patent
Liu et al.

(10) Patent No.: US 8,555,128 B2
(45) Date of Patent: Oct. 8, 2013

(54) SYSTEM AND METHOD FOR TRANSMITTING AND RECEIVING ACKNOWLEDGEMENT INFORMATION

(75) Inventors: Deping Liu, Schaumburg, IL (US); Yufei Blankenship, Kildeer, IL (US); Bingyu Qu, Schaumburg, IL (US)

(73) Assignee: FutureWei Technologies, Inc., Plano, TX (US)

( * ) Notice: Subject to any disclaimer, the term of this patent is extended or adjusted under 35 U.S.C. 154(b) by 355 days.

(21) Appl. No.: 13/007,302

(22) Filed: Jan. 14, 2011

(65) Prior Publication Data

US 2011/0239076 A1    Sep. 29, 2011

Related U.S. Application Data

(60) Provisional application No. 61/317,196, filed on Mar. 24, 2010.

(51) Int. Cl.
*H03M 13/00* (2006.01)

(52) U.S. Cl.
USPC ............ 714/751; 714/749; 714/781; 370/335

(58) Field of Classification Search
USPC .......................... 714/748–751, 781; 370/335
See application file for complete search history.

(56) References Cited

U.S. PATENT DOCUMENTS

2009/0300456 A1* 12/2009 Pelletier et al. .............. 714/749

FOREIGN PATENT DOCUMENTS

| CN | 101527623 A | 9/2009 |
|---|---|---|
| CN | 101588224 A | 11/2009 |
| CN | 101594211 A | 12/2009 |
| WO | WO 2009-157859 A2 | 12/2009 |

OTHER PUBLICATIONS

International Search Report and Written Opinion of Patent Cooperation Treaty (PCT), International Application No. PCT/CN2011/071944, date of mailing Jul. 7, 2011, Applicant Huawei Technologies Co., Ltd., 8 pages.
European Search Report, Application No. PCT/CN2011/071944, date of mailing Nov. 27, 2012, Applicant Huawei Technologies Co., Ltd., 4 pages.
Ericsson, "A/N transmission in the uplink for carrier aggregation," R1-100044, 3GPP TSG-RAN WG1 #59bis, Jan. 18-22, 2010, 3 pages, Valencia Spain.
Ericsson, "A/N transmission in the uplink for carrier aggregation," R1-100909, 3GPP TSG-RAN WG1 #60, Feb. 22-26, 2010, 4 pages, San Francisco, CA, USA.

(Continued)

*Primary Examiner* — Guy Lamarre
(74) *Attorney, Agent, or Firm* — Slater & Matsil, L.L.P.

(57) ABSTRACT

A system and method for transmitting and receiving acknowledgement information are provided. A method for communications device operations includes determining a hybrid automatic repeat request (HARQ) response for each CC in a set of configured CCs, thereby producing a set of HARQ responses, generating an information vector from the set of HARQ responses, encoding the information vector, and transmitting the encoded information vector. A sub-vector of one or more bits selected from the information vector is assigned a fixed vector value independent of HARQ responses for CCs not in a set of CCs when the set of CCs is not empty, where the set of CCs comprises at least one CC whose HARQ response is equal to DTX.

28 Claims, 12 Drawing Sheets

(56) References Cited

OTHER PUBLICATIONS

"3rd Generation Partnership Project; Technical Specification Group Radio Access Network; Evolved Universal Terrestrial Radio Access (E-UTRA); Multiplexing and channel coding (Release 9)," 3GPP TS 36.212, V9.0.0, Dec. 2009, 61 pages.

"3rd Generation Partnership Project; Technical Specification Group Radio Access Network; Evolved Universal Terrestrial Radio Access (E-UTRA); Physical layer procedures (Release 9)," 3GPP TS 36.213, V9.0.1, Dec. 2009, 79 pages.

"3rd Generation Partnership Project; Technical Specification Group Radio Access Network; Further Advancements for E-UTRA Physical Layer Aspects (Release 9)," 3GPP TR 36.814, V1.5.0, Nov. 2009, 53 pages.

\* cited by examiner

|   | CC #1 | (2 BITS) | |
|---|---|---|---|
| 1 | 0 | 0 | A,A |
| 2 | 1 | 0 | N,A |
| 3 | 0 | 1 | A,N |
| 4 | 1 | 1 | N,N |

*Fig. 10a*

| CC #2 | | CC #1 | | (5 BITS) | |
|---|---|---|---|---|---|
| <u>1</u> | 0 | 0 | 0 | 0 | |
| <u>1</u> | 0 | 0 | 1 | 0 | |
| <u>1</u> | 0 | 0 | 0 | 1 | |
| <u>1</u> | 0 | 0 | 1 | 1 | |
| <u>1</u> | 1 | 0 | 0 | 0 | |
| <u>1</u> | 1 | 0 | 1 | 0 | |
| <u>1</u> | 1 | 0 | 0 | 1 | |
| <u>1</u> | 1 | 0 | 1 | 1 | NO DTX |
| <u>1</u> | 0 | 1 | 0 | 0 | |
| <u>1</u> | 0 | 1 | 1 | 0 | |
| <u>1</u> | 0 | 1 | 0 | 1 | |
| <u>1</u> | 0 | 1 | 1 | 1 | |
| <u>1</u> | 1 | 1 | 0 | 0 | |
| <u>1</u> | 1 | 1 | 1 | 0 | |
| <u>1</u> | 1 | 1 | 0 | 1 | |
| <u>1</u> | 1 | 1 | 1 | 1 | |
| <u>0</u> | <u>0</u> | <u>1</u> | 0 | 0 | |
| <u>0</u> | <u>0</u> | <u>1</u> | 1 | 0 | CC #2=A/N; CC #1=DTX |
| <u>0</u> | <u>0</u> | <u>1</u> | 0 | 1 | |
| <u>0</u> | <u>0</u> | <u>1</u> | 1 | 1 | |
| <u>0</u> | <u>0</u> | <u>0</u> | 0 | 0 | |
| <u>0</u> | <u>0</u> | <u>0</u> | 1 | 0 | CC #2=DTX; CC #1=A/N |
| <u>0</u> | <u>0</u> | <u>0</u> | 0 | 1 | |
| <u>0</u> | <u>0</u> | <u>0</u> | 1 | 1 | |

*Fig. 10b*

|   |   |   | CC#3 | CC#2 | CC#1 | (7 BITS) |   |
|---|---|---|---|---|---|---|---|
|   |   |   | 1 | ALL A/N COMBINATIONS OF THREE CCS | | | } NO DTX |
|   | 0 | 1 | 1 | ALL A/N COMBS OF TWO CCS | | | } CC#1=A/N CC#2=A/N CC#3=DTX |
|   | 0 | 1 | 0 | ALL A/N COMBS OF TWO CCS | | | } CC#1=A/N CC#2=DTX CC#3=A/N |
|   | 0 | 0 | 1 | ALL A/N COMBS OF TWO CCS | | | } CC#1=DTX CC#2=A/N CC#3=A/N |
| 0 | 0 | 0 | 1 | 0 | ALL COMBS OF 1 CC | | } CC#1=A/N CC#2=DTX CC#3=DTX |
| 0 | 0 | 0 | 1 | 0 | ALL COMBS OF 1 CC | | } CC#1=DTX CC#2=A/N CC#3=DTX |
| 0 | 0 | 0 | 1 | 0 | ALL COMBS OF 1 CC | | } CC#1=DTX CC#2=DTX CC#3=A/N |

*Fig. 10c*

| CC#4 | CC#3 | CC#2 | CC#1 | | | | | (10 BITS) | |
|---|---|---|---|---|---|---|---|---|---|
| 1 | 0 | | | ALL A/N COMBINATIONS OF FOUR CCS | | | | | NO DTX |
| 0 | 1 | 0 | 1 | ALL A/N COMBS OF THREE CCS | | | | —1005 | ONE DTX |
| 0 | 1 | 0 | 0 | ALL A/N COMBS OF THREE CCS | | | | | |
| 0 | 0 | 1 | 1 | ALL A/N COMBS OF THREE CCS | | | | | |
| 0 | 0 | 1 | 0 | ALL A/N COMBS OF THREE CCS | | | | —1010 | |
| 0 | 0 | 0 | 1 | 1 | 0 | ALL COMBS OF TWO CCS | | | TWO DTX |
| 0 | 0 | 0 | 1 | 0 | 1 | ALL COMBS OF TWO CCS | | | |
| 0 | 0 | 0 | 1 | 0 | 0 | ALL COMBS OF TWO CCS | | | |
| 0 | 0 | 0 | 0 | 1 | 1 | ALL COMBS OF TWO CCS | | | |
| 0 | 0 | 0 | 0 | 1 | 0 | ALL COMBS OF TWO CCS | | | |
| 0 | 0 | 0 | 0 | 0 | 1 | ALL COMBS OF TWO CCS | | | |
| 0 | 0 | 0 | 0 | 0 | 0 | 1 | 1 | ALL COMBS OF 1 CC | THREE DTX |
| 0 | 0 | 0 | 0 | 0 | 0 | 1 | 0 | ALL COMBS OF 1 CC | |
| 0 | 0 | 0 | 0 | 0 | 0 | 0 | 1 | ALL COMBS OF 1 CC | |
| 0 | 0 | 0 | 0 | 0 | 0 | 0 | 0 | ALL COMBS OF 1 CC | |

*Fig. 10d*

| | | | | | | CC#5 CC#4 CC#3 CC#2 CC#1 (12 BITS) | |
|---|---|---|---|---|---|---|---|
| 1 | 1 | | | | | ALL A/N COMBINATIONS OF FIVE CCS | NO DTX |
| 1 | 0 | 0 | 0 | | | ALL A/N COMBINATIONS OF FOUR CCS | ONE DTX |
| 0 | 1 | 1 | 1 | | | ALL A/N COMBINATIONS OF FOUR CCS | |
| 0 | 1 | 1 | 0 | | | ALL A/N COMBINATIONS OF FOUR CCS | |
| 0 | 1 | 0 | 1 | | | ALL A/N COMBINATIONS OF FOUR CCS | |
| 0 | 1 | 0 | 0 | | | ALL A/N COMBINATIONS OF FOUR CCS | |
| 0 | 0 | 1 | 1 | 0 | 0 | ALL A/N COMBS OF THREE CCS | TWO DTX |
| 0 | 0 | 1 | 0 | 1 | 1 | ALL A/N COMBS OF THREE CCS | |
| 0 | 0 | 1 | 0 | 1 | 0 | ALL A/N COMBS OF THREE CCS | |
| 0 | 0 | 1 | 0 | 0 | 1 | ALL A/N COMBS OF THREE CCS | |
| 0 | 0 | 1 | 0 | 0 | 0 | ALL A/N COMBS OF THREE CCS | |
| 0 | 0 | 0 | 1 | 1 | 1 | ALL A/N COMBS OF THREE CCS | |
| 0 | 0 | 0 | 1 | 1 | 0 | ALL A/N COMBS OF THREE CCS | |
| 0 | 0 | 0 | 1 | 0 | 1 | ALL A/N COMBS OF THREE CCS | |
| 0 | 0 | 0 | 1 | 0 | 0 | ALL A/N COMBS OF THREE CCS | |
| 0 | 0 | 0 | 0 | 1 | 1 | ALL A/N COMBS OF THREE CCS | |

*Fig. 10e-1*

| CC#5 | CC#4 | | CC#3 | | CC#2 | | CC#1 | | (12 BITS) | |
|---|---|---|---|---|---|---|---|---|---|---|
| 0 | 0 | 0 | 0 | 1 | 0 | 1 | 1 | | ALL A/N COMBS OF 2 CCS | ⎫ |
| 0 | 0 | 0 | 0 | 1 | 0 | 1 | 0 | | ALL A/N COMBS OF 2 CCS | |
| 0 | 0 | 0 | 0 | 1 | 0 | 0 | 1 | | ALL A/N COMBS OF 2 CCS | |
| 0 | 0 | 0 | 0 | 1 | 0 | 0 | 0 | | ALL A/N COMBS OF 2 CCS | |
| 0 | 0 | 0 | 0 | 0 | 1 | 1 | 1 | | ALL A/N COMBS OF 2 CCS | THREE DTX |
| 0 | 0 | 0 | 0 | 0 | 1 | 1 | 0 | | ALL A/N COMBS OF 2 CCS | |
| 0 | 0 | 0 | 0 | 0 | 1 | 0 | 1 | | ALL A/N COMBS OF 2 CCS | |
| 0 | 0 | 0 | 0 | 0 | 1 | 0 | 0 | | ALL A/N COMBS OF 2 CCS | |
| 0 | 0 | 0 | 0 | 0 | 0 | 1 | 1 | | ALL A/N COMBS OF 2 CCS | |
| 0 | 0 | 0 | 0 | 0 | 0 | 1 | 0 | | ALL A/N COMBS OF 2 CCS | ⎭ |
| 0 | 0 | 0 | 0 | 0 | 0 | 0 | 1 | 0 0 | ALL A/N COMBS OF 1 CC | ⎫ |
| 0 | 0 | 0 | 0 | 0 | 0 | 0 | 0 | 1 1 | ALL A/N COMBS OF 1 CC | |
| 0 | 0 | 0 | 0 | 0 | 0 | 0 | 0 | 1 0 | ALL A/N COMBS OF 1 CC | FOUR DTX |
| 0 | 0 | 0 | 0 | 0 | 0 | 0 | 0 | 0 1 | ALL A/N COMBS OF 1 CC | |
| 0 | 0 | 0 | 0 | 0 | 0 | 0 | 0 | 0 0 | ALL A/N COMBS OF 1 CC | ⎭ |

*Fig. 10e-2*

SYSTEM AND METHOD FOR TRANSMITTING AND RECEIVING ACKNOWLEDGEMENT INFORMATION

This application claims the benefit of U.S. Provisional Application No. 61/317,196, filed Mar. 24, 2010, entitled "Methods and Devices of Transmitting and Receiving Acknowledge Information," which application is hereby incorporated herein by reference.

TECHNICAL FIELD

The present invention relates generally to wireless communications, and more particularly to a system and method for transmitting and receiving acknowledgement information.

BACKGROUND

Generally, in a wireless communications system, such as a Third Generation Partnership Project (3GPP) Long Term Evolution (LTE) compliant communications system, there are physical data channels and physical control channels. The physical control channels may convey information to assist data communications, which occur over the physical data channels.

FIG. 1 illustrates a communications system 100. Communications system 100 may be a 3GPP LTE compliant communications system. Communications system 100 includes an enhanced NodeB (eNB) 105, which may also be commonly referred to as a base station, base transceiver station, controller, communications controller, and so forth. eNB 105 may control communications to and from a user equipment (UE) 110. UE 110 may also be referred to as a mobile station, terminal, user, subscriber, and so on. Communications from eNB 105 to UE 110 may occur over a downlink (DL) channel, while communications from UE 110 to eNB 105 may occur over an uplink (UL) channel.

A hybrid automatic repeat request (HARD) mechanism is a mechanism in a 3GPP LTE compliant communications system that allows a transmitter of a data packet (e.g., an eNB) to retransmit the data packet if a receiver of the data packet (e.g., a UE) fails to decode it. The eNB may add a cyclic redundancy code (CRC) to a transport block and transmit the data packet. Upon receipt, the UE may attempt to decode the data packet. If the data packet passes CRC check, then the UE may feed back an acknowledgement (represented as ACK or A) to the eNB. If the data packet fails CRC check, then the UE may feed back a negative acknowledgement (represented as NACK or N) to the eNB. If the eNB receives a NACK, the eNB may retransmit the data packet.

If the UE fails to locate a transmission intended for it, the UE may feed back a discontinuous transmission (represented as DTX) to the eNB. The DTX state may be fed back in a manner that the UE feeds back nothing (e.g., keep silent) to the eNB transmitter. If the eNB receives a DTX and if the eNB transmitted a data packet that corresponds to the DTX from the UE, the eNB may retransmit the data packet. However, if the eNB receives a DTX from the UE and it did not make a transmission to the UE, then the eNB may chose to not respond to the DTX.

FIG. 2 illustrates a prior art physical channel structure of a 3GPP LTE compliant communications system. As discussed previously, communications systems communicate over a DL channel (shown in FIG. 2 as channel 205) and an UL channel (shown in FIG. 2 as channel 210).

In a 3GPP LTE compliant communications system, multiple channels may be multiplexed over a single set of physical channel resource(s). Both control signaling and data may be carried over a single set of network resources. As shown in DL channel 205, control signaling may be carried in a first portion of network resources (shown as physical downlink control channel (PDCCH)) and data may be carried in a second portion of network resources (shown as physical downlink shared channel (PDSCH)). The PDCCH may include indications of network resources assigned to UEs. For example, indicator 215 may be an indication to network resources 216 assigned to a first UE, and indicator 218 may be an indication to network resources 219 assigned to a second UE, and so forth. In general, a UE detects its PDCCH and then determines a location of network resources allocated to it by the eNB and detects data transmitted to it at the location of the network resources.

If the UE fails to detect its PDCCH, the UE cannot receive a transmission since it does not know where to locate the transmission. The UE may feed back a DTX to the eNB. In a 3GPP LTE compliant communications system, the DTX state is fed back from a UE by transmitting nothing on PUCCH, which does not distinguish the case where there is no PDCCH for the UE in the subframe and the case that there is PDCCH for the UE but the UE failed to detect it. If the eNB has not scheduled any transmissions to the UE, then there may not be a PDCCH intended for the UE.

UL channel 210 may be used to convey HARQ acknowledgements from the UEs in the 3GPP LTE compliant communications system, potentially with other information. As an example, network resources 225 may be used to convey HARQ acknowledgements from the first UE and network resources 226 may be used to convey HARQ acknowledgements from the second UE.

ACK/NACK feedback control signaling may consume a considerable amount of overhead, especially when higher bandwidth (i.e., more data packets) deployments are utilized, and may therefore negatively impact the overall performance of the communications system. Therefore, there is a need for a system and method to reduce the negative impact on performance due to a larger overhead associated with ACK/NACK control signaling.

SUMMARY OF THE INVENTION

These and other problems are generally solved or circumvented, and technical advantages are generally achieved, by preferred embodiments of the present invention which provides a system and method for transmitting and receiving acknowledgement information.

In accordance with a preferred embodiment of the present invention, a method for communications device operations is provided. The method includes determining a hybrid automatic repeat request (HARQ) response for each CC in a set of configured CCs, thereby producing a set of HARQ responses, generating an information vector from the set of HARQ responses, encoding the information vector, and transmitting the encoded information vector. A sub-vector of one or more bits selected from the information vector is assigned a fixed vector value independent of HARQ responses for CCs not in a set of CCs when the set of CCs is not empty, where the set of CCs comprises at least one CC whose HARQ response is equal to DTX.

In accordance with another preferred embodiment of the present invention, a method for communications device operations is provided. The method includes decoding a received encoded information vector, the encoded information vector includes a hybrid automatic repeat request (HARQ) response for each component carrier (CC) in a set of configured CCs, and generating individual HARQ responses from the information vector. The decoding makes use of a priori information about a subset of CCs from a set of configured CCs used to transmit information from the communications device, thereby producing an information vector.

In accordance with another preferred embodiment of the present invention, a method for transmitting multiple hybrid automatic repeat request (HARQ) responses is provided. The method determining a first set of component carrier (CC), determining a second set of CC, which does not contain any CC in the first set of CC, assigning a set of bits of an information vector to a fixed vector value, wherein the fixed vector value is based on the first set of CC, assigning remaining bits in the information vector to values based on the second set of CC, encoding the information vector, and transmitting the encoded information vector. The first set of CC includes CC for which a HARQ response is DTX.

In accordance with another preferred embodiment of the present invention, a communications device is provided. The communications device includes a response unit, a mapper coupled to the response unit, and an encoder coupled to the mapper. The response unit determines a hybrid automatic repeat request (HARQ) response for each transport block (TB) of each component carrier (CC) in a set of configured CCs assigned to the communications device, and the mapper generates an information vector from HARQ responses produced by the response unit and the set of configured CCs. A sub-vector of one or more bits selected from the information vector is assigned a fixed vector value regardless of HARQ responses for CCs not in a set of CCs when the set of CCs is not empty, where the set of CCs is a set of CCs whose HARQ response is equal to a specified value. The encoder encodes the information vector.

In accordance with another preferred embodiment of the present invention, a communications device is provided. The communications device includes a decoder, a generator coupled to the decoder, and a processor coupled to the generator. The decoder is coupled to an information source and decodes an encoded information vector provided by the information source. The decoder makes use of a priori information about a subset of component carriers (CC) from a set of configured CCs used to transmit information. The generator produces individual hybrid automatic repeat requested (HARQ) responses from an output of the decoder, and the processor processs each of the individual HARQ responses.

An advantage of an embodiment is that a receiver of an encoded ACK/NACK vector, such as an eNB, may be able to use a priori information regarding allocated component carriers (CC) to help improve decoding performance.

A further advantage of an embodiment is that a transmitter of an encoded ACK/NACK vector, such as a UE, may be able to utilize ACK/NACK information in conjunction with a configured CC set to encode the ACK/NACK vector in such a way that may help a receiver (e.g., an eNB) of the encoded ACK/NACK vector realize improved decoding performance.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 10a through 10e are diagrams of possible combinations of ACK/NACK information vectors for one to five CCs;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a 3GPP LTE-Advanced (LTE-A) compliant communications system that supports component carriers. The invention may also be applied, however, to other communications systems, such as WiMAX compliant communications systems, that support the use of multiple carriers to convey transmissions to a single user and an aggregation of ACK/NACK responses onto a single channel.

In a 3GPP LTE-A compliant communications system, support for greater bandwidth through carrier aggregation is provided. Generally, in carrier aggregation, two or more component carriers (CC), with each having a bandwidth of up to 20 MHz, may be aggregated. A maximum of five CCs may be aggregated for a total bandwidth of up to 100 MHz.

In a 3GPP LTE compliant communications system, DL spatial multiplexing of up to four multiple input, multiple output (MIMO) layers is supported, while up to eight MIMO layers are supported in a 3GPP LTE-A compliant communications system. In case of spatial multiplexing, up to two transport blocks (TB) may be transmitted to a scheduled UE in a subframe per DL CC. Correspondingly, for HARQ ACK/NACK operation in the UL, one UL ACK/NACK feedback is needed per DL TB.

There may be several cases wherein only one ACK/NACK feedback exists for one CC. They include, but are not limited to:

Only one TB is sent on the DL
  Only one TB is transmitted to a UE on a CC in an initial transmission and/or retransmission,
  Two TBs are scheduled in a first transmission and a first TB is correctly received (decoded) by the UE while a second TB is not. Then, when the eNB schedules a retransmission, only the incorrectly received TB is retransmitted without rescheduling a new TB to be transmitted with it. Therefore, only one ACK/NACK feedback in response to the retransmission of the previously incorrectly received TB is needed.
When spatial ACK/NACK bundling is used due to limited UL channel quality, there will be only one bundled ACK/NACK feedback for the two TBs in the case of TDD.

Figure 1:
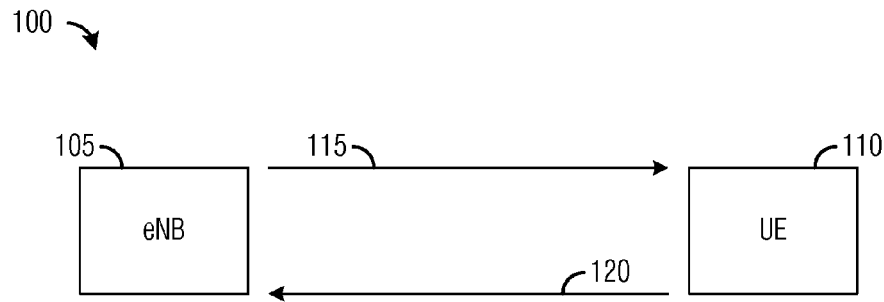
FIG. 1 is a diagram of a communications system.
Figure 2:
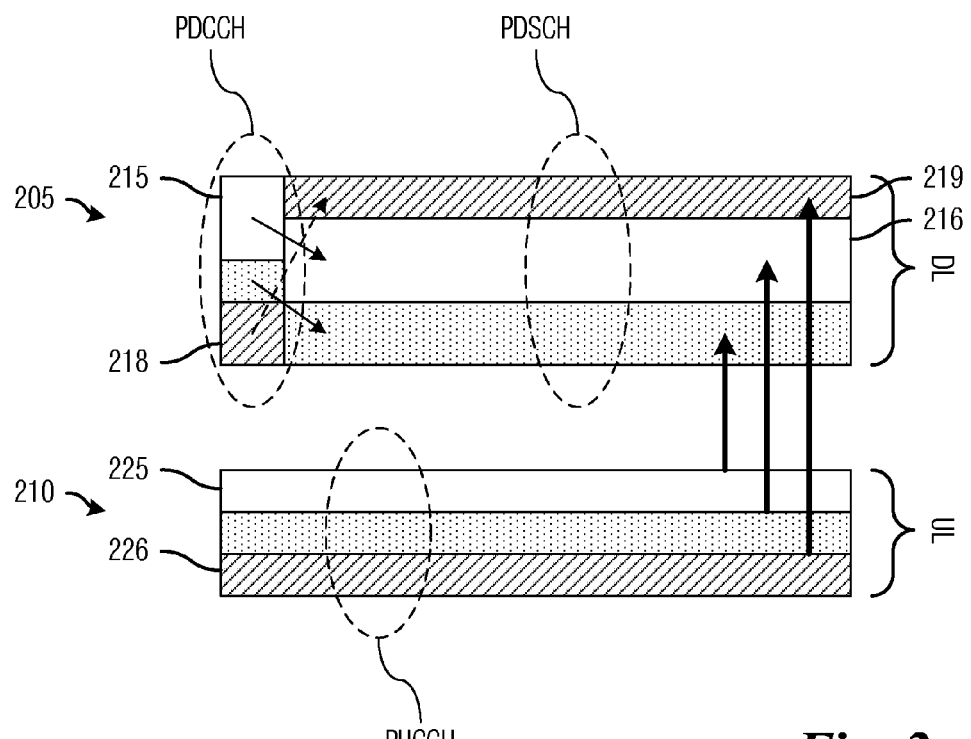
FIG. 2 is a diagram of a prior art physical channel structure of a 3GPP LTE compliant communications system.

In a 3GPP LTE-A compliant communications system, there may be an independent HARQ entity for each CC, which enables the HARQ processes of each CC to be implemented independently. Furthermore, there may be one PDCCH for each PDSCH located on each CC. The PDCCH may be located in the same CC as its corresponding PDSCH or may be in a different CC from its corresponding PDSCH (refer to FIG. 2 for an overview of the PDCCH and PDSCH). Accordingly, the ACK/NACK information corresponding to the TBs on each CC may be processed independently. If a UE has multiple DL CCs to receive transmitted data, then multiple simultaneous ACK/NACK feedbacks may be generated and transmitted to the eNB from the UE.

As discussed previously, in a 3GPP LTE-A compliant communications system, each CC may have up to two TB, therefore, there are up to two ACK/NACK feedbacks per CC per UE, and a maximum of five CCs may be aggregated for a single UE, therefore, there may be up to ten ACK/NACK feedbacks from a single UE for frequency division duplexed (FDD) operations. With time division duplexed (TDD) operations, there are up to two ACK/NACK feedbacks per CC corresponding to one DL subframe from a UE, and there are several UL-DL configurations, among which there may be up to eight (4*2) ACK/NACK feedbacks in the case of a configuration with four DL subframes and one UL subframe for one CC. Furthermore, the maximum number of aggregated CCs for a single UE is five. Therefore, there may be up to 40 (5*4*2) ACK/NACK feedbacks from a single UE.

For a single CC with one TB, there may be a total of three states of the form (TB1):
  (ACK)
  (NACK) and
  (DTX).
For a single CC with two TBs, there may be a total of five possible state two-tuples of the form (TB1, TB2):
  (ACK, ACK)
  (ACK, NACK)
  (NACK, ACK)
  (Nack, Nack) and
  (DTX).

Figure 3A:
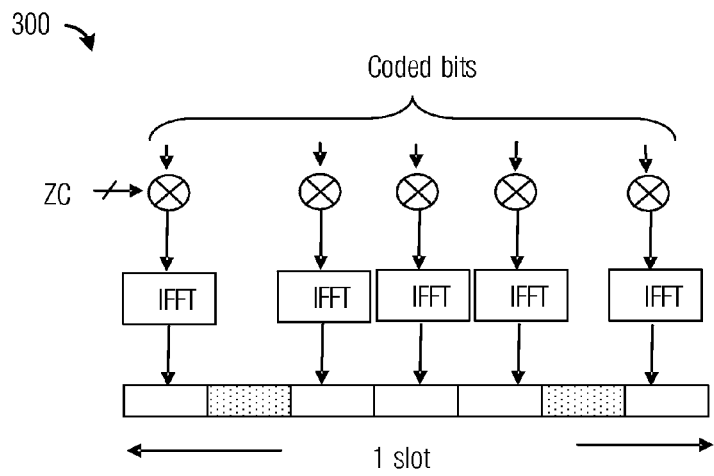
FIG. 3a is a diagram of a first technique for transmitting multiple ACK/NACK feedbacks.

FIG. 3a illustrates a technique 300 for transmitting multiple ACK/NACK feedbacks. As shown in FIG. 3a, technique 300 may reuse the PUCCH format #2 as described in the 3GPP LTE technical standards, wherein the UE separately modulates coded ACK/NACK information bits with Zadoff-Chu-like sequences, and places the modulated signals into multiple symbols in a single slot (one subframe comprises two slots). Technique 300 may be able to transmit up to 13 ACK/NACK information bits that are encoded into 20 coded bits.

Figure 3B:
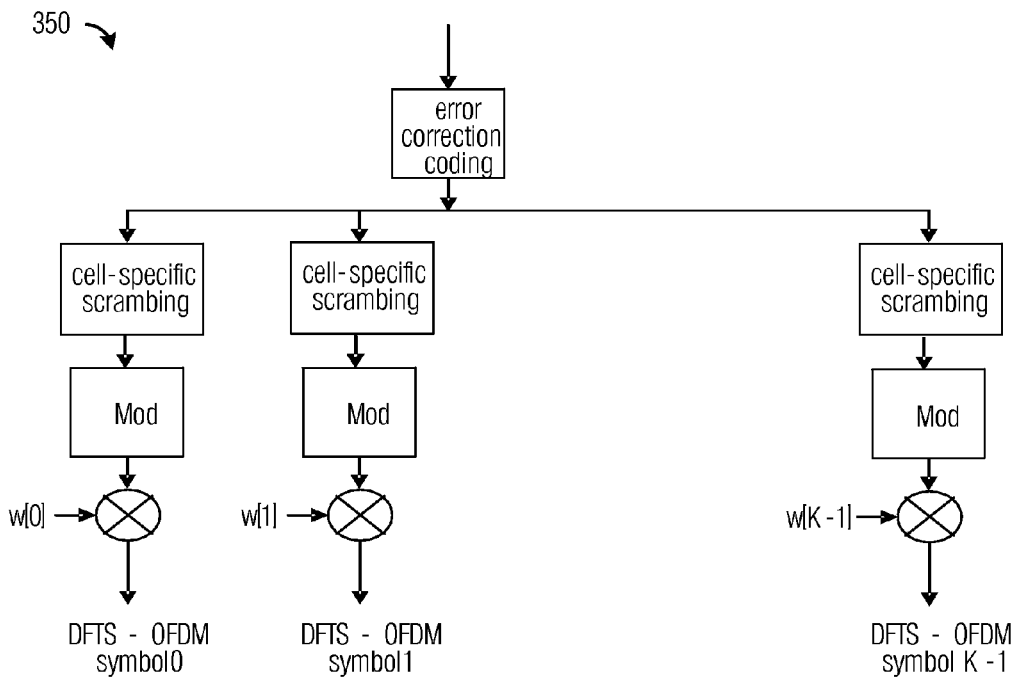
FIG. 3b is a diagram of a second technique for transmitting multiple ACK/NACK feedbacks.

FIG. 3b illustrates a technique 350 for transmitting multiple ACK/NACK feedbacks with DFT-S-OFDM. As shown in FIG. 3b, technique 350 employs a spreading factor $\{w[0], w[1], \ldots, w[K-1]\}$ to spread the ACK/NACK information bits. Technique 350 may be able to support 48 or more coded bits for transmission from UE to the eNB.

If there are multiple DL CCs for a UE data transmission, the UE needs to feed back to eNB the ACK/NACK information corresponding to the TBs on the multiple CCs. A number of joint ACK/NACK states (a combination of ACK/NACK states to be fed back to the eNB) depends on the number of CCs, as well as the number of ACK/NACK feedbacks for each CC, as described previously. The UE needs to map the ACK/NACK information (e.g., the joint ACK/NACK states) of the multiple CCs to a plurality of ACK/NACK information bits (i.e., an ACK/NACK information vector), and then encode the plurality of ACK/NACK information bits by, for example, linear block coding to form code word(s) for transmission purposes. Then the UE transmits the code word(s) after modulation in a UL channel, such as UL control channel (PUCCH).

As an example, a simplest way to map the joint ACK/NACK states to binary digital information bits is to denote the number of all the possible states as x, where x is an integer; and then use a combination of $k=\text{ceil}(\log_2 x)$ bits to denote each state. If y is an integer, where $(y-1)<x\leq y$, then function $\text{ceil}(x)=y$.

If there are N ($1\leq N\leq 5$) DL CCs for a UE, then an upper end case is that there will be a total of $(5^N-1)$ possible ACK/NACK states to feed back to the eNB when the UE is scheduled dual TBs on each the N CCs (here, a "−1" term may be used to represent that nothing will be transmitted if DTX occurs on all the CCs). On a lower end case, there will be a total of $(3^N-1)$ possible ACK/NACK states that need to be encoded and feed back when single TB is schedule on each of the N CCs or spatial bundling is used on all CCs. Then k, where k is an integer, bits are needed to transmit each ACK/NACK state to eNB according to the equation $k=\text{ceil}[\log_2(5^N-1)]$ for the upper end case (or $k=\text{ceil}[\log_2(3^N-1)]$ for the lower end case).

In general if there are p CCs needing five ACK/NACK feedback states per CC, and q CCs needing three ACK/NACK feedback states per CC (where p and q are integers), a total of $\text{ceil}[\log_2(5^p \cdot 3^q-1)]$ bits are needed. As an example, consider a situation with two CCs and two ACK/NACK feedbacks for each CC case, then x=24 states, and $$k=\text{ceil}(\log_2 x)=\text{ceil}(\log_2 24)=5 \text{ bits},$$

which can represent up to $2^k=2^5=32$ states. A rule may then be constructed to select 24 combinations of the k bits to indicate the 24 ACK/NACK states.

Table 1 lists a number of CCs, number of ACK/NACK states, and number of ACK/NACK information bits needed to represent the states for a configuration where there are two TBs per CC per UE.

TABLE 1

Number of joint ACK/NACK states, and number of bits needed to represent the joint ACK/NACK states for a variety of CCs wherein there are two TBs per CC per UE.

| N (number of CCs) | N = 1 | N = 2 | N = 3 | N = 4 | N = 5 |
|---|---|---|---|---|---|
| Number of joint ACK/NACK states of the N CCs | $5^1 - 1 =$ 4 | $5^2 - 1 =$ 24 | $5^3 - 1 =$ 124 | $5^4 - 1 =$ 624 | $5^5 - 1 =$ 15624 |
| Number of ACK/NACK information bits ($k = \text{ceil}[\log_2(5^N - 1)]$) | 2 | 5 | 7 | 10 | 12 |

The number of ACK/NACK information bits in a communications system operating in TDD mode also depends on a ratio of DL subframes and UL subframes, as discussed previously.

A UE may have multiple DL CCs for data transmission depending on the radio resource control (RRC) configuration and the media access control (MAC) activation. The RRC layer configures a CC set. The MAC layer may activate or deactivate CC(s) to adapt to a UE's real traffic from the perspective of power savings, for example. The UE feeds back the ACK/NACK information bits for the CC set configured by RRC and/or MAC.

A scheduler in the eNB performs scheduling within the CC set according to the channel condition and other factors. For example, in a communications system supporting carrier aggregation, some of the CCs may be in lower frequency band which provides relatively larger coverage. The eNB (scheduler) may schedule some UEs only in the CCs in lower frequency band to gain better channel quality when other CCs in the higher frequency band experience poor channel quality. A special case may be to schedule a UE only on its DL primary CC which is linked to the UL CC on which its UL control signaling is transmitted.

When the eNB schedules a CC to transmit data packet(s) to a UE, the UE may fail to obtain the PDSCH because it misses the corresponding PDCCH. The UE can not distinguish two situations: (a) there is no data packet scheduled for it in the subframe; or (b) there is data packet scheduled but it misses the corresponding PDCCH. The UE may respond with DTX in both situations. Therefore, it may be difficult to make a UE map the ACK/NACK feedbacks based on the scheduled CC set since it is difficult for a UE to know the scheduled CC set since the scheduled CC set may be dynamic in nature and continued signaling of the scheduled CC set may consume a significant amount of overhead. So the UE will map the ACK/NACK feedbacks based on the configured CC set, as configured by RRC and/or MAC.

Figure 4:
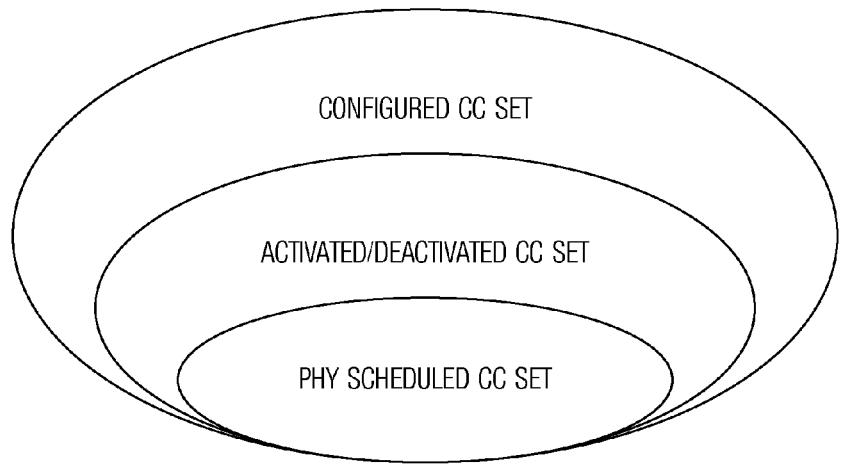
FIG. 4 is a diagram of a relative relationship of a configured CC set, an activated/deactivated CC set, and a scheduled CC set.

If N DL CCs are configured by MAC and/or RRC for a UE, the ACK/NACK feedbacks are mapped based on a configured CC set, but if only M CCs are scheduled in a time transmission interval, where M is an integer and M<N, it may not be efficient to transmit the ACK/NACK feedbacks using a ACK/NACK transmission scheme generally designed for N configured CCs. So a problem is how to efficiently transmit the possible ACK/NACK feedbacks to eNB if multiple DL CCs are activated and/or configured for a UE, but only a subset of the multiple activated and/or configured DL CCs is scheduled in a certain time transmission interval. FIG. 4 illustrates a relative relationship of a configured CC set, an activated/deactivated CC set, and a scheduled CC set.

Similarly, for TDD, there will be multiple DL subframes but the ACK/NACK feedbacks should be fed back in only one single UL subframe, so there will be multiple ACK/NACK feedbacks for multiple DL suframes. Carrier aggregation is also supported in TDD, so there will be multiple subframes and/or component carriers to feedback ACK/NACK feedbacks. For simplicity, the ACK/NACK feedbacks for a CC in multiple subframes in a TDD system may be regarded as ACK/NACK feedbacks for multiple CCs in a subframe. The definition may be applicable for the following description for multiple component carriers.

Figure 5:
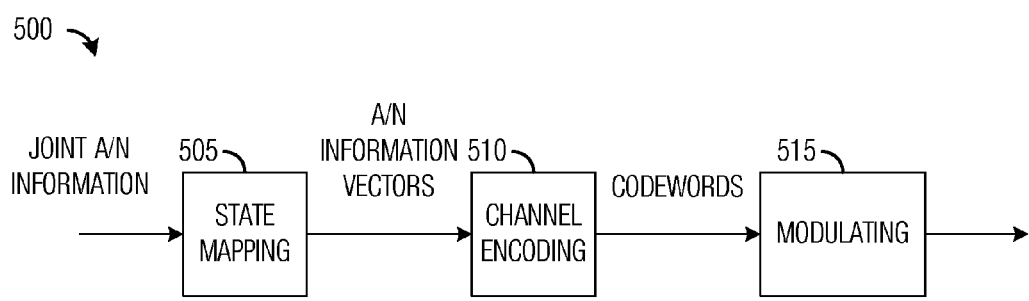
FIG. 5 is a diagram of information processing of ACK/NACK information by a UE.

FIG. 5 illustrates information processing 500 of ACK/NACK information by a UE. Information processing 500 may be illustrative of processing of ACK/NACK information at a UE as the UE processes ACK/NACK information of transmissions made by an eNB to the UE for HARQ operation.

The UE may begin by performing a state mapping 505 of ACK/NACK feedbacks in the form of ACK/NACK states generated by the UE based on its error checking of transmissions from the eNB. Based on the error checkings of transmissions, the UE may designate the ACK/NACK feedback of a transmission as being an ACK if the UE successfully error checked the transmission without error, a NACK if the UE unsuccessfully error checked the transmission with error, or a DTX if the UE did not detect a control channel indication related to the transmission. State mapping 505 may be performed by a state mapper and may take as input joint ACK/NACK information (e.g., the ACK/NACK states) and produce an ACK/NACK information vector(s).

State mapping 505 may follow mapping rules defined by the UE, the eNB, an operator of a communications system in which the UE operates, a technical specification, or so on. According to an embodiment, state mapping 505 may also make use of a configured CC set in the mapping of the ACK/NACK information into the ACK/NACK information vectors.

The UE may then perform a channel encoding 510 of the ACK/NACK information vector(s) to produce a code word(s). According to an embodiment, a linear block code may be used by a channel encoder to channel encode the ACK/NACK information vector(s). A detailed description of channel encoding 510 and the linear block code is provided below. The UE may then perform a modulating on the code word(s) to prepare the code word(s) for transmission to the eNB.

As discussed above, a linear block code may be selected to encode the ACK/NACK information vector(s). A block code of length n and $2^k$ codewords is called a linear (n, k) code if only if its $2^k$ codewords form a k-dimensional subspace of the vector space of all the n-tuples over the field GF(2). It is possible to find k linearly independent generator matrix vectors, $\vec{g}_0, \vec{g}_1, \ldots, \vec{g}_{k-1}$, in an (n, k) linear code C such that every codeword $\vec{v}$ in C is a linear combination of these k generator matrix vectors, $$\vec{v} = u_0 \vec{g}_0 + u_1 \vec{g}_1 + \ldots + u_{k-1} \vec{g}_{k-1},$$

where $u_i = 0$ or 1 for $0 \leq i < k$. Arrange these k linearly independent generator matrix vectors as the rows of k×n matrix as follows:

$$\vec{G} = \begin{bmatrix} \vec{g}_0 \\ \vec{g}_1 \\ \vdots \\ \vdots \\ \vec{g}_{k-1} \end{bmatrix} = \begin{bmatrix} g_{00} & g_{01} & \cdots & g_{0,n-1} \\ g_{10} & g_{11} & \cdots & g_{1,n-1} \\ \cdots & & & \\ \cdots & & & \\ \cdots & & & \\ g_{k-1,0} & g_{k-1,1} & \cdots & g_{k-1,n-1} \end{bmatrix},$$

where $\vec{g}_i = (g_{i0}, g_{i1}, \ldots, g_{i,n-1})$ for $0 \leq i < k$. If $\vec{u} = (u_0, u_1, \ldots u_{k-1})$ is the information vector to be encoded, the corresponding codeword can be given as follows:

$$\vec{v} = \vec{u} \times G.$$

Clearly, the rows of $\vec{G}$ generate the (n, k) linear code C, so the matrix $\vec{G}$ is called a generator matrix for C.

The minimum distance is an important parameter of a block code, which determines the random-error-detecting and random-error-correcting capabilities of a code. The (Hamming) weight of vector $\vec{v}$, denoted by $w(\vec{v})$, is defined as the number of nonzero components of $\vec{v}$. The minimum distance of a linear block code is equal to the minimum weight of its nonzero codewords and vice versa.

For linear block encoding method, such as Reed-Muller code or modified Reed-Muller code, the minimum distance is determined by it's generator matrix. In 3GPP TS 36.212, there are two block code designs originated from Reed-Muller codes. A first block code is referred to as (20, A) code and is shown in Table 2. Table 3 shows the minimum distance of (20, A) code with various values of A.

TABLE 2

Basis sequences for (20, A) code.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

TABLE 3

The minimum distance of the (20, A) code with various A.

| A | 1 | 2 | 3 | 4 | 5 | 6 | 7 | 8 | 9 | 10 | 11 | 12 | 13 |
|---|---|---|---|---|---|---|---|---|---|---|---|---|---|
| n = 20 | 20 | 10 | 8 | 8 | 8 | 8 | 6 | 6 | 6 | 6 | 4 | 4 | 4 |

A second block code is referred to as (32, O) code and is shown in Table 4. Table 5 shows the minimum distance of (32, O) code with various values of O.

TABLE 4

Basis sequences for (32, O) code.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |

TABLE 4-continued

Basis sequences for (32, O) code.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

TABLE 5

The minimum distance of the (32, O) code of various O.

| O | 1 | 2 | 3 | 4 | 5 | 6 | 7 | 8 | 9 | 10 | 11 | 12 | 13 |
|---|---|---|---|---|---|---|---|---|---|---|---|---|---|
| n = 32 | 32 | 16 | 16 | 16 | 16 | 16 | 12 | 12 | 12 | 12 | 10 | 10 | 8 |

If the scheduled CCs are a subset of the configured CC set, and the code words after channel encoding for the scheduled CCs have the bigger minimum distance than the minimum distance of whole code book of the configured CC set, better decoding performance of ACK/NACK information will be obtained for the scheduled CCs.

For example, in the (32, O) Reed-Muller code, if O=1, the codeword generated by the first vector in the generator matrix has the biggest minimum distance of 32 and if O=2, . . . , 6, the codeword generated by the first vector through the sixth vector in the generator matrix have the bigger minimum distance of 16 than the code words generated by any other O vectors in the matrix, at least equal. If O>6, the codeword have relatively smaller minimum distance.

As shown in Tables 3 and 5, smaller values of A and O result in codewords with a larger minimum distance, which may yield better decoding performance of codewords encoded with the linear block code.

Figure 6:
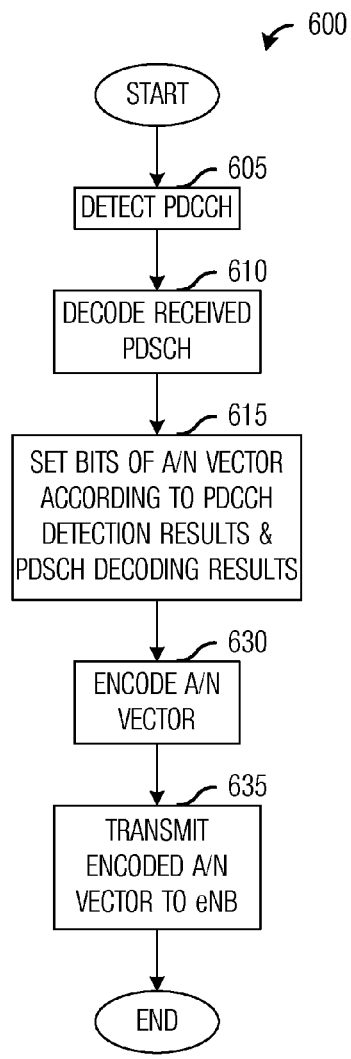
FIG. 6 is a flow diagram of UE operations in transmitting ACK/NACK information to an eNB.

FIG. 6 illustrates a flow diagram of UE operations 600 in transmitting ACK/NACK information to an eNB. UE operations 600 may be indicative of operations occurring in a UE as the UE generates and transmits ACK/NACK information to an eNB in response to transmissions made to the UE by the eNB. The transmissions made to the UE may be over multiple CCs with one or more TBs per CC. UE operations 600 may occur while the UE is in a normal operation mode.

UE operations 600 may begin with the UE detecting its PDCCH (block 605). The UE may detect its PDCCH in order to determine if there are any transmissions scheduled for it over the associated CCs in the subframe. Furthermore, if there are transmissions scheduled for the UE, the UE may be able to determine locations of the transmissions, such as frequencies and/or times, using the information carried by the PDCCH.

If the UE failed to detect its PDCCH for a certain CC, where a PDCCH may or may not have been transmitted by the eNB, then the UE may not be able to detect its corresponding PDSCH and therefore be unable to receive the transmissions scheduled for it. The A/N feedback for the CC corresponding to the failed PDCCH detection is then DTX.

If there are data transmissions scheduled for the UE on a CC, the UE may (at specified frequencies and/or times) receive the transmissions, which are carried by PDSCH for 3GPP LTE, for example. After receiving the transmissions, the UE may decode the transmissions (block 610) then check the transmissions for errors, e.g., using a CRC. For each transmission, the UE may determine an ACK/NACK feedback based on results of the error check. For example, if the error check passed for a transmission, then the UE may set the ACK/NACK feedback to an ACK for the transmission. If the error check failed for a transmission, then the UE may set the ACK/NACK feedback to a NACK for the transmission. One or more A/N information may exist for a CC, since one or more transmissions may have been sent simultaneously over a CC.

Based on the joint ACK/NACK feedback for each of the transmissions over the configured CC set, the receiver may set bits of an ACK/NACK information vector(s) using mapping rule(s) (block 615). The setting of the bits of the ACK/NACK information vector(s) may be set based on state mapping rules.

According to an embodiment, failure to detect its PDCCH may be represented with an ACK/NACK feedback of DTX (or a NULL value) for the associated CC. The UE may then set bits in the ACK/NACK information vector(s) that correspond to CCs in a configured CC set with the DTX ACK/NACK feedback to a fixed value. The fixed value may be a vector of one or more bits in length. The fixed value vector may be a known vector value or an otherwise specified vector value. Parameters such as what bits the first set comprises and the value of the first set of bits vary depending on scenario, for example, which combination of CCs have DTX, the number of TBs scheduled on a CC, and so forth. As an example, the values can be predefined in a technical standard. The ACK/NACK information of the CC(s) with ACK or NACK responses (i.e., not DTX) may be mapped to the second set of bits in the information vector, where the second set and the first set do not overlap for a given combination of CCs with DTX.

As an example, the bits corresponding to undetected CCs in the CC set may be set to a binary zero or some other prespecified or predefined value. For discussion purposes, if one bit in an ACK/NACK information vector corresponds to a CC in the configured CC set with the DTX state, then the one bit may be set to a fixed value (e.g., either a binary one or a binary zero). As discussed previously, the fixed value may be a prespecified or predefined value. If two bits in an ACK/NACK information vector corresponds to a CC in the configured CC set with the DTX state, then the two bits may be set to a fixed value (e.g., either a '00', '01', '10', or '11'). If three bits in an ACK/NACK information vector corresponds to a CC in the configured CC set with the DTX state, then the three bits may be set to a fixed value (e.g., either a '000', '001', '010', '011', '100', '101', '110', or '111').

Although the above examples illustrate situations wherein a single CC in the configured CC set is determined to be in the DTX state, the embodiments presented herein may be operable with any number of CCs in the configured CC set being determined to be in the DTX state as long as the number of CCs in the DTX state is smaller than a total number of CCs in the configured CC set. Therefore, the discussion of a single CC being determined to be in the DTX state should not be construed as being limiting to either the scope or the spirit of the embodiments.

Furthermore, the above examples illustrate situations wherein one, two, or three bits of an ACK/NACK information vector corresponds to a CC in the configured CC set with the DTX state. However, any number of bits less than the total number of information vector bits may correspond to a set of CCs. Therefore, the discussion of one, two, or three bits should not be construed as being limiting to either the scope or the spirit of the embodiments.

Figure 7A:
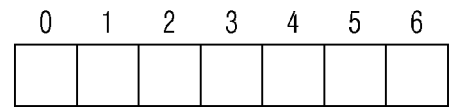
FIGS. 7a and 7b are diagrams of an ACK/NACK information vector with and without a bit set to a fixed value.

As an example, consider a situation wherein there are three CCs in a configured CC set and two TBs are transmitted on each CC. The ACK/NACK states for two TBs on a single CC may be {(ACK, ACK), (ACK, NACK), (NACK, ACK), (NACK, NACK), (DTX)}. There is a total of 124 joint ACK/NACK states for the three CCs, thereby requiring seven ACK/NACK information bits, $b_0 b_1 b_2 b_3 b_4 b_5 b_6$, to denote the 124 states, as shown in FIG. 7a. As shown in FIG. 7a, the seven ACK/NACK information bits may be set to any of the 124 values based on receiver's detection of transmissions occurring on the CCs in the configured CC set.

Figure 7B:
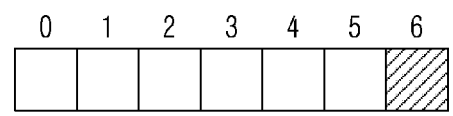

However, if the ACK/NACK state for one CC is DTX (e.g., CC #3), then the ACK/NACK feedbacks with at least the ACK/NACK state for CC #3 being DTX may be mapped to the combination of ACK/NACK information bits $b_0 b_1 b_2 b_3 b_4 b_5 b_6$ out of which at least one of the bits (e.g., $b_6$) is set to a fixed value c, as shown in FIG. 7b. As shown in FIG. 7b, bit $b_6$ is set to the fixed value c (as an example, the fixed value c may be equal to zero or one), while the remaining bits (bits $b_0$ through $b_5$) may be set to values dependent on the UE's ACK/NACK feedbacks for transmissions occurring on the remaining CCs in the configured CC set.

In other words, all ACK/NACK states where the ACK/NACK feedback corresponding to CC #3 is DTX, but ACK/NACK feedback for other CCs may be or may not be DTX, are mapped to the ACK/NACK information vector(s) whose bit $b_6$ (as an example) is fixed with value c (e.g., zero). The ACK/NACK feedbacks for CC #1 and CC #2 (which may be {(ACK, ACK), (ACK, NACK), (NACK, ACK), (NACK, NACK), (DTX)} for each CC) are represented by bits $b_0 b_1 b_2 b_3 b_4 b_5$ (as an example). The first set of bits comprises $\{b_6\}$, the fixed value is $b_6=0$, and the second set comprises $\{b_0 b_1 b_2 b_3 b_4 b_5\}$.

Although the illustrative examples shown in FIGS. 7a and 7b show that the last bit ($b_6$) is set to a fixed value in case of the DTX state of ACK/NACK feedback corresponding to CC #3, any bit position may be set to the fixed value in case of the DTX state of ACK/NACK feedback corresponding to CC #3. Furthermore, more than one bit may be set to fixed value(s) in case of the DTX state of ACK/NACK feedback corresponding to CC #3. The actual bit position(s) set to fixed value(s) in case of the DTX state of ACK/NACK feedback of corresponding CC(s) may be dependent on the mapping rules used to map the ACK/NACK states to the ACK/NACK information vector(s). Therefore, the discussion of the illustrative examples should not be construed as being limiting to either the scope or the spirit of the embodiments.

In general, the joint ACK/NACK states wherein the ACK/NACK feedback for a CC subset $CC_{DTX}$ (a CC set such that the ACK/NACK feedback to the CCs in the CC set is DTX) of component carrier(s) is DTX, are mapped to a combinations of the information bits with a first set of bits being assigned fixed value(s). For example, $CC_{DTX}$ may be {CC #1}, {CC #1, CC #3}, and so forth. Each different $CC_{DTX}$ may correspond to a different first set of bits, and/or a different fixed value for the first set of bits.

In another example, the joint ACK/NACK states wherein the ACK/NACK feedback for at least one CC is DTX, are mapped to the ACK/NACK information vectors whose bit $b_6$ is the fixed value 0. In this example, if ACK/NACK feedback corresponding to CC #1 and/or CC #2 and/or CC #3 {excluding the case where all CCs are DTX which implies no UL transmission for ACK/NACK feedback} is DTX, then the joint ACK/NACK states are mapped to the combinations of ACK/NACK information bits wherein the bit $b_6$ is the fixed value c. In general, the joint ACK/NACK states with ACK/NACK feedback having at least M CCs in the DTX state are mapped to the combinations of information bits with a first set of bits assigned fixed values. For example, if 3 CCs are configured and M=1, then the information vector corresponding to joint ACK/NACK states of three $CC_{DTX}$ sets, {CC1}, {CC2}, {CC3}, share the feature that a first set of bits are assigned the same fixed value. The three $CC_{DTX}$ sets may not be differentiated by the first set of bits.

Referring back to the examples shown in FIGS. 7a and 7b, the number of possible ACK/NACK states where the ACK/NACK feedback includes at least one of the CCs being determined to be DTX, is 60. If $b_6$ is fixed, there are 64 possible combinations for $\{b_0 b_1 b_2 b_3 b_4 b_5 b_6 | b_6 = c\}$, which is sufficient to denote the 60 possible ACK/NACK states.

Returning back to FIG. 6, after state mapping, the ACK/NACK information vector(s) may then be encoded (block 630). Preferably, a linear block code, such as a Reed-Muller code, a punctured Reed-Muller code, or so on, may be used to encode the ACK/NACK information vector(s).

For discussion purposes, let a mother code defined for the configured N CCs be a (n, k) linear block code. Let the size of a first set of bits be $L_1$ bits, $0 < L_1 < k$. Fixing the value of the first set of bits in the information vector may be equivalent to expurgate the (n, k) mother block code to a (n, k-$L_1$) block code. The bits in the first set of bits may be arranged such that the code performance of the resulting (n, k-$L_1$) block code is optimized. For example, the (n, k-$L_1$) code may be optimized to have the highest minimum distance, or the lowest block error rate at a given SNR in AWGN channel.

In order to achieve this goal, the first set of bits may be selected to correspond to arbitrary rows of the generator matrix. Depending on which bits are in the first set of bits, a different (n, k-$L_1$) code may result. For example, if k=7, $L_1$=1, different (n, 6) codes are derived from the same (n, 7) mother code depending on if the first set of bits comprises {$b_0$ or $b_1$} or {$b_2$ or $b_4$}, and the fixed values assigned to the first set of bits (e.g., $b_0$ or $b_1$=0 or $b_0$ or $b_1$=1).

As an example, within the linear block code (20, A) generator matrix, the minimum distance of the (20, 7) code is smaller than the (20, 6) code due to the addition of a $7^{th}$ row of the generator matrix. However, setting the $7^{th}$ bit of the ACK/NACK information vector to be a fixed value, for example, effectively expurgates the (20, 7) code to the (20, 6) code when the ACK/NACK feedback corresponding to some CCs is DTX. For these ACK/NACK states, a larger minimum distance (corresponding to the (20, 6) code) is obtained comparing to using the (20, 7) code without such structure.

Suppose that a length-k ACK/NACK information vector is used to represent the joint ACK/NACK states on N configured CCs. A subset of the N configured CCs may be determined to have the feedback DTX due to either (a) certain configured CCs are not scheduled with data packets or (b) the PDCCH on certain configured CCs are missed by the UE. When a subset of the N configured CCs has the DTX feedback state, there are no longer ($5^N-1$) states to be presented. Thus it may be sufficient to use a subset of the information vector to represent the remaining CCs that may or may not have the DTX feedback state. The number of bits with fixed values (i.e., the size of the first set of bits) out of k bits should not be bigger than an integer x, where (k-x) bits should be enough to represent the all the joint ACK/NACK states with at least the ACK/NACK states of CCs in a group $CC_{DTX}$ being DTX. In other words, $2^{(k-x)}$ must be bigger or equal than the number of all possible joint ACK/NACK states for the remaining CCs which may or may not have the DTX feedback state.

As an example, when three CCs are configured (e.g., configured CC set=3), there is a need for a total of seven bits to represent all the joint ACK/NACK states. The number of joint ACK/NACK states when one of the CCs (e.g., CC #1) is DTX is $5^2-1$ (=31). Since $2^5=32>5^2-1$, five bits are enough to represent all the joint ACK/NACK states with one of the CCs having the DTX property (i.e., with CC #1 having the DTX ACK/NACK state). Therefore all the joint ACK/NACK states with the A/N information of CC #1 being in the DTX ACK/NACK state can be mapped to the length-7 ACK/NACK information vector with two bits (e.g., $b_5b_6$) being assigned fixed values.

Returning back to FIG. 6, after encoding the ACK/NACK information vector(s), the encoded ACK/NACK information vector(s) may then be modulated and transmitted back to the transmitter (block 635). Receiver operations 600 may then terminate.

Figure 8:
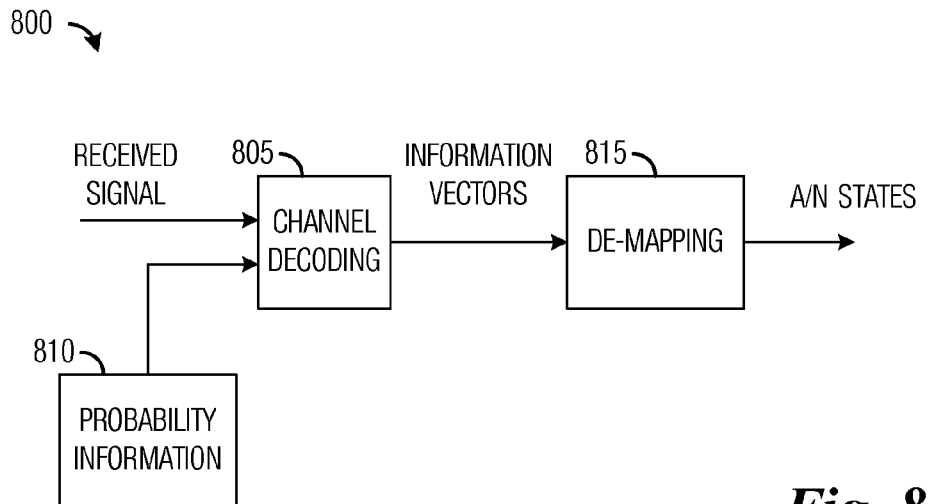
FIG. 8 is a diagram of information processing of ACK/NACK information by an eNB.

FIG. 8 illustrates information processing 800 of ACK/NACK information by a communications device. Information processing 800 may be illustrative of processing of ACK/NACK information at a communications device, such as an eNB, that originally transmitted information resulting in the ACK/NACK information as the eNB processes ACK/NACK information received from a UE (a communications device that received the transmitted information from the eNB) for HARQ operation.

Figure 9:
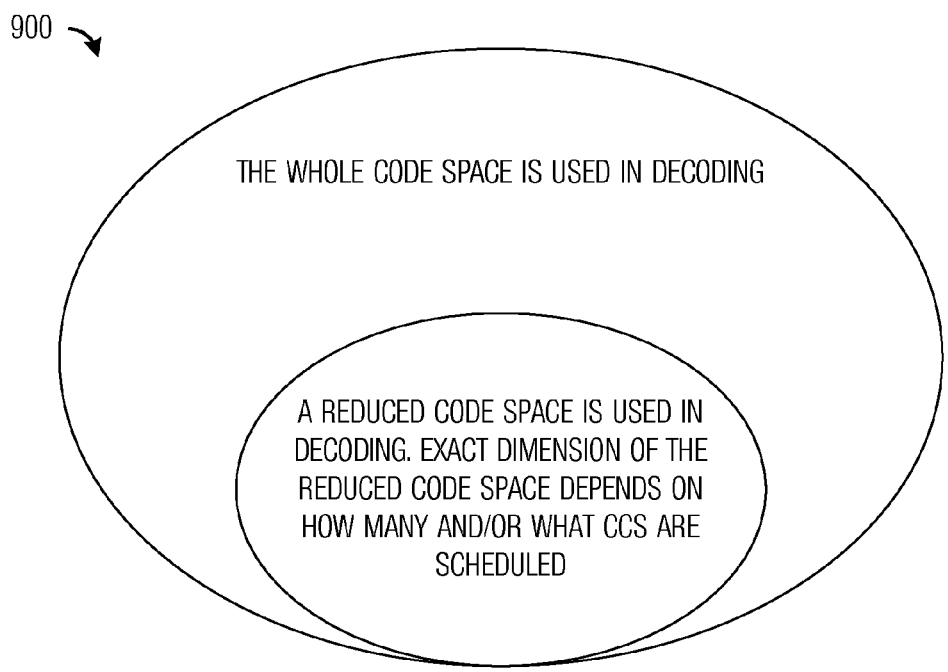
FIG. 9 is a diagram of a relationship of a whole code space and a reduced code space based on a priori knowledge of scheduled CCs.

The eNB may begin with a received signal received from the UE. According to an embodiment, the UE may transmit the signal to the eNB over a PUCCH. The received signal may include an encoded (and modulated) ACK/NACK information vector(s). The eNB may perform channel decoding 805 on the received signal. However, instead of performing channel decoding 805 over an entirety of a code space of the received signal, the eNB knows which CCs it scheduled (out of a configured CC set) and it may be able to potentially reduce the size of the code space of the received signal. Decoding the received signal in a smaller code space may simplify the decoding of the received signal. The eNB may make use of probability information 810, which is based on its a priori knowledge of which CCs have been scheduled. FIG. 9 illustrates a relationship 900 of a whole code space that is based on the configured CC set and a reduced code space based on a priori knowledge of scheduled CCs.

Returning now to FIG. 8, expurgating the (n, k) mother block code to a (n, k–$L_1$) block code implies that the code space is reduced from $2^k$ codewords to $2^{k-L_1}$ codewords. As $L_1$ increases, the number of possible codewords decreases exponentially. A decoder in the eNB may leverage this property to reduce the decoder complexity and improve decoding performance.

Since the eNB knows exactly which CCs are scheduled out of the configured CC set, the eNB can use the CC scheduling information as a priori knowledge for decoding an encoded ACK/NACK information vector carried on a PUCCH, where the encoded ACK/NACK information vector includes the joint ACK/NACK states. If the eNB doesn't transmit TBs to a UE on some CCs, a probability is close to one that ACK/NACK feedback corresponding to those CCs is DTX (or a combination NACK/DTX state). With the a priori information, the eNB may use an a priori probability of 100%, or slightly less than 100% (e.g., 90% or 95%), in its decoder implementation. An actual probability used in the decoder is an implementation issue and may be different depending on design and performance choices. The probability may be adjusted based on the performance requirement, depending on a false positive probability of the receiver's detection of the PDCCH, for example. A detailed description of channel decoding 805 is provided below.

After channel decoding 805 and producing a decoded ACK/NACK information vector, the decoded ACK/NACK information vector may undergo a de-mapping 815 to produce joint ACK/NACK states. De-mapping 815 may make use of mapping rule(s) that correspond to mapping rules used by the UE in its mapping of ACK/NACK states to the ACK/NACK information vector. The mapping rule(s) may be pre-specified or predefined. The eNB may then process the joint ACK/NACK states. For example, if there is a NACK corresponding to a CC and/or TB, the transmitter may schedule a retransmission on the CC and/or TB.

For Reed-Muller code or other codes related to first order Reed-Muller code, a Fast Hadamard Transform (FHT) may be used to reduce the complexity of decoding. The received signal may first be multiplied by one mask out of all masks which are all linear combinations of the last several rows of the generator matrix for the code. Then the FHT may be applied to the received signal to get the correlation values. A different mask may then be chosen and the same procedure reapplied, thereby producing the correlation values. The correlation values may then be compared to produce results of the channel decoding.

Therefore for a linear block code, if the information bits include M bits that are selected to have fixed values, then there may be fewer masks. Hence the complexity of decoding is reduced.

Considering a linear block code of different lengths, for example a Reed-Muller code, the addition of vectors into the generator matrix causes a decrease in the minimum distance. It can be seen that there are several levels of minimum distances as the size of the generator matrix grows. Referencing Table 2 as an example, when there is only a first vector in the generator matrix, the minimum distance is 20, while with the addition of extra vectors, the minimum distance decreases monotonically from 20 to 10, 8, 6, and 4.

As discussed previously, selecting (k–$L_1$) bits from the length-k ACK/NACK information vector to build a second set of bits (the set of bits that optimizes the resulting (n, k–$L_1$)

code) is based on a mother code. If there are multiple levels of expurgation built into the information vector, e.g., $L_{1,1} > L_{1,2} > L_{1,3}$, and so forth, the mother code may be progressively reduced to a to a $(k-L_{1,1})$ code, a $(k-L_{1,2})$ code, a $(k-L_{1,3})$ code, and so on. In this case, the second set may be grown progressively, which corresponds to a progressive shrinking of the first set. For example, if a criteria that the minimum distance of the block code should be maximized, then the following procedure may be used. It is straightforward to substitute other performance criteria other than maximizing $d_{min}$.

1. Selecting $(k-L_{1,1})$ bits from the ACK/NACK information vector as the second set of bits. The second set of bits are selected to maximize the $d_{min}$ of the $(n, k-L_{1,1})$ code from the $(n, k)$ mother code. Let the $L_{1,1}$ bits not selected be the first set of bits and assign them a fixed value;

2. Selecting $(L_{i,j}-L_{1,j-1})$ bits from the first set of bits and move them to the second set of bits, where the $d_{min}$ of the $(n, k-L_{1,j-1})$ code derived from the $(n, k)$ mother code is maximized. Let the remaining $L_{1,j-1}$ bits be the first set and assigned it a fixed value; and 3. Repeat step 2 until desired levels are obtained.

According to the binomial theorem:

$$(1+b)^N = \sum_{i=0}^{N} C_N^i 1^{N-i} b^i,$$

where $$C_N^i = \frac{N!}{(N-i)! i!}.$$

Let positive integer N be the number of CCs in the configured CC set. Denote the combination of the possible ACK/NACK states for two TBs on one CC as {(ACK, ACK), (ACK, NACK), (NACK, ACK), (NACK, NACK), (DTX)}. Set b=4, then for i CCs with ACK or NACK feedback (i.e., N−i CCs have the ACK/NACK state DTX), where 0<i≤n the total number of possible joint ACK/NACK states, is $C_N^i 1^{N-i} b^i = C_N^i 4^i$.

If i=0, N−i=N, which means ACK/NACK feedback states for all the CCs is DTX, nothing will be transmitted by the UE, and there is no need to denote this state. If i=N, N−i=0, no DTX occurs, and ACK/NACK states feedback corresponding to TBs on all CCs is needed.

TABLE 6

The number of CC for a UE is 2, N = 2.

| N = 2 | Number of ACK/NACK states that the ACK/NACK feedback to (N − i) CCs is DTX: $C_N^i 4^i$ | Total number of ACK/NACK states(statenum): $\sum_{j=0}^{i} C_N^j 4^j - 1$ the ACK/NACK feedback to {(N − 1), (N − 2), ..., (N − i)\|0 <i <= N} CCs is DTX | Number of bits needed to denote the scenario: ceil(log$_2$ statenum) |
|---|---|---|---|
| i = 1 | (N − i = 1, ACK/NACK feedback to 1 CC out of total 2 CCs is DTX) 8 | 8 | 3 |
| i = 2 | (N − i = 0, no DTX occurs) 16 | 24 = (8 + 16) | 5 |

TABLE 7

The number of active CC for a UE is 3, N = 3.

| N = 3 | Number of ACK/NACK states that the ACK/NACK feedback to (N − i) CCs is DTX: $C_N^i 4^i$ | Total number of ACK/NACK states(statenum): $\sum_{j=0}^{i} C_N^j 4^j - 1$ the ACK/NACK feedback to {(N − 1), (N − 2), ..., (N − i)\| 0 < i <= N} CCs is DTX | Number of bits needed to denote the scenario: ceil(log$_2$ statenum) |
|---|---|---|---|
| i = 1 | (N − i = 2, DTX to 2 CCs out of total 3 CCs) 12 | 12 | 4 |
| i = 2 | (N − i = 1, DTX to 1 CC out of total 3 CCs) 48 | 60 | 6 |
| i = 3 | (N − i = 0, no DTX to any CCs occurs) 64 | 124 | 7 |

TABLE 8

The number of active CC for a UE is 4, N = 4.

| | N = 4, Number of ACK/NACK states that the ACK/NACK feedback to (N − i) CCs is DTX: $C_N^i 4^i$ | Total number of ACK/NACK states(statenum): $\sum_{j=0}^{i} C_N^j 4^j - 1$ the ACK/NACK feedback to $\{(N-1), (N-2), \ldots, (N-i) \mid 0 < i <= N\}$ CCs is DTX | Number of bits needed to denote the scenario: ceil(log$_2$ statenum) |
|---|---|---|---|
| i = 1 | (N − i = 3, DTX to 3 CCs out of total 4 CCs) 16 | 16 | 4 |
| i = 2 | (N − i = 2, DTX to 2 CCs out of total 4 CCs) 96 | 112 | 7 |
| i = 3 | (N − i = 1, DTX to 1 CC out of total 4 CCs) 256 | 368 | 9 |
| i = 4 | (N − i = 0, no DTX to any CCs occurs) 256 | 624 | 10 |

TABLE 9

The number of active CC for a UE is 5, N = 5.

| | N = 5, Number of ACK/NACK states that the ACK/NACK feedback to (N − i) CCs is DTX: $C_N^i 4^i$ | Total number of ACK/NACK states(statenum): $\sum_{j=0}^{i} C_N^j 4^j - 1$ the ACK/NACK feedback to $\{(N-1), (N-2), \ldots, (N-i) \mid 0 < i <= N\}$ CCs is DTX | Number of bits needed to denote the scenario: ceil(log$_2$ statenum) |
|---|---|---|---|
| i = 1 | (N − i = 4, DTX to 4 CCs out of total 5 CCs) 20 | 20 | 5 |
| i = 2 | (N − i = 3, DTX to 3 CCs out of total 5 CCs) 160 | 180 | 8 |
| i = 3 | (N − i = 2, DTX to 2 CCs out of total 5 CCs) 640 | 820 | 10 |
| i = 4 | (N − i = 1, DTX to 1 CC out of total 5 CCs) 1280 | 2100 | 12 |
| i = 5 | (N − i = 0, no DTX to any CCs occurs) 1024 | 3124 | 12 |

Consider a situation with three CCs in the configured CC set for a single UE. A total of seven bits is needed to represent all possible joint ACK/NACK states. The seven bits may be denoted as $b_0 b_1 b_2 b_3 b_4 b_5 b_6$. Suppose that $d_0 d_1 d_2 d_3 d_4 d_5 d_6$ is a permutation of $b_0 b_1 b_2 b_3 b_4 b_5 b_6$, if the block code shown in Table 2 is used for channel coding, then the first six vectors have the minimum distance of eight. If the seventh vector is included, the minimum distance is reduced to six.

When $$i = N - 1 = 2,$$

$$\sum_{j=0}^{i} C_3^j 4^j - 1 = C_3^1 \cdot 2^2 + C_3^2 \cdot 2^2 \cdot 2^2 = 60,$$

then a total of six bits are needed to represent all states as shown in Table 7, which means the number of ACK/NACK states in the case that ACK/NACK feedback includes at least one CC with the ACK/NACK state of DTX. So set an information bit, e.g., $d_6$, to be a fixed binary value, either 0 or 1, denoted by $c_1$. There are a total of 64 combinations left when $\{d_0d_1d_2d_3d_4d_5d_6|d_6=c_1\}$, hence there are enough combinations to denote each of the ACK/NACK states in the case that ACK/NACK feedback includes at least one CC that is DTX.

By setting the seventh bit ($d_6$), for example, to be fixed value $c_1$, all the joint ACK/NACK states containing the DTX information can be denoted by the combinations of the first six bits which correspond to the subset of larger minimum distance within the generator matrix row vector groups. This may enhance the decoding performance.

If more than one of the ACK/NACK states within all of the joint ACK/NACK states contain DTX information need further decoding performance enhancement, for example, when $$i=1, \sum_{j=0}^{i} C_3^j 4^j - 1 = C_3^1 \cdot 2^2 = 12,$$

a total of 4 bits is needed to indicate the number of ACK/NACK states in the situation where ACK/NACK feedback includes to two CCs in the DTX state as shown in Table 7. Therefore, (7−4)=3 bits may possibly be fixed. Thus, in addition to assigning $d_6=c_1$, the information bits $\{d_4,d_5\}$, for example, may be set to a fixed binary value denoted by $\{c_3, c_2\}$, $c_3$ and $c_2$ may be 1 or 0. There are a total of $2^4=16$ combinations left when $\{d_0d_1d_2d_3d_4d_5d_6|d_4=c_3,d_5=c_2, d_6=c_1\}$, hence there are enough combinations to denote joint ACK/NACK states that ACK/NACK feedback includes two CCs that are in the DTX state.

For a case with two CCs in the configured CC set, a total of five bits $d_0d_1d_2d_3d_4$ are needed to represent the possible joint ACK/NACK states. As shown in Table 6, the last two bits $d_3d_4$ may be set to be fixed value, then the combinations of $d_0d_1d_2$ can represent all the joint ACK/NACK states where the ACK/NACK feedback includes one CC that is in the DTX state.

For a case with four CCs in the configured CC set, a total of 10 bits $d_0d_1d_2d_3d_4d_5d_6d_7d_8d_9$ are needed to represent the possible joint ACK/NACK states. As shown in Table 8, the last one bit $d_9$ (for example) can be set to be fixed value, then the combinations of $d_0d_1d_2d_3d_4d_5d_6d_7d_8$ can denote all the possible ACK/NACK states containing one CC that is in the DTX state. Also, bits $d_7d_8$ (for example) may be set to a fixed value, the combinations of $d_0d_1d_2d_3d_4d_5d_6$ can denote all the possible ACK/NACK states for the ACK/NACK states containing two CCs that are in the DTX state, and bits $d_4d_5d_6$ (for example) may be set to a fixed value, the combinations of $d_0d_1d_2d_3$ can denote all the possible ACK/NACK states for the ACK/NACK feedback containing three CCs that are in the DTX state.

Similarly, in a case with five CCs in the configured CC set, 12 bits $d_0d_1d_2d_3d_4d_5d_6d_7d_8d_9d_{10}d_{11}$ are needed to represent all of the possible ACK/NACK states. As shown in Table 9, bits $d_{10}d_{11}$ (for example) may be set to fixed values in order to achieve decoding performance enhancement of all the possible ACK/NACK states for the ACK/NACK feedback containing two CCs, three CCs, or four CCs that are in the DTX state. Furthermore, bits $d_8d_9$ (for example) may be set to fixed values in order to achieve decoding performance enhancement of all the possible ACK/NACK states for the ACK/NACK feedback containing three CCs or four CCs that are in the DTX state, and bits $d_5d_6d_7$ (for example) may be set to fixed values in order to achieve decoding performance enhancement of all the possible ACK/NACK states for the ACK/NACK feedback containing four CCs that are in the DTX state.

Suppose $d_0d_1 \ldots d_{k-1}$ is a permutation of $b_0b_1 \ldots b_{k-1}$, then for the first y bits $d_0d_1 \ldots d_{y-1}$ (where y is a natural number and y<k) out of the k bits, the particular value of y depends on the number of ACK/NACK states to be indicated (y=ceil[$\log_2$(statenum)]), and are to denote the ACK/NACK states needing high decoding performance. While the remaining (k−y) bits $d_yd_{y+1} \ldots d_{k-1}$ are set to be fixed values to increase the minimum distance.

In a scenario where there are only a few ACK/NACK states to be fed back and the ACK/NACK information should provide high decoding performance, such as when the ACK/NACK feedback corresponding to a certain CC while the ACK/NACK feedback corresponding to other CCs is the DTX state, or a bundling of the ACK/NACK feedback corresponding to one or more CCs, or a single TB is scheduled (including for retransmission) on multiple CCs, and so forth, if there are a total of N CCs for a single UE, then a total of k=ceil[$\log_2(5^N-1)$] or k=ceil[$\log_2(3^N-1)$] (where k is a natural number) bits are needed to represent all the ACK/NACK states.

If there are three DL CCs assigned to a single UE, then k=7 bits. Set the first two bits $d_0d_1$ to denote the ACK/NACK states that there are three CCs in the configured CC set but only a first CC, for example, a primary CC, is scheduled or only a PDCCH corresponding to a PDSCH on the first CC is successfully detected, thereby implying that the ACK/NACK feedback for the other two CCs is DTX. Assuming that value one is for ACK and value zero is for NACK, then the remaining 5 (=7-2) bits may be set to values (e.g., 00000) known both by eNB and UEs. All the remaining ACK/NACK states, totaling 120 ($=5^3-1-2^2$) ACK/NACK states, are mapped to the 124 ($=2^7-2^2$) remaining combinations. Since the number of the remaining combinations is larger than the number of the remaining ACK/NACK states, every state can have a corresponding bit combination. Table 10 displays a number of possible ACK/NACK information bit combinations.

TABLE 10

Possible ACK/NACK information bit combinations.

| | | | | | | | |
|---|---|---|---|---|---|---|---|
| The ACK/NACK information bit combination 1 | <u>0</u> | <u>0</u> | 0 | 0 | 0 | 0 | 0 |
| The ACK/NACK information bit combination 2 | <u>0</u> | <u>1</u> | 0 | 0 | 0 | 0 | 0 |
| The ACK/NACK information bit combination 3 | <u>1</u> | <u>0</u> | 0 | 0 | 0 | 0 | 0 |
| The ACK/NACK information bit combination 4 | <u>1</u> | <u>1</u> | 0 | 0 | 0 | 0 | 0 |
| The ACK/NACK information bit combination . . . | X | X | X | X | X | X | X |

In a situation with N CCs assigned to a single UE, where N is an integer value, a specified order of all N CCs for purpose of ACK/NACK feedback may be known by both the eNB and the UE. For example, an ordering may be based on CC priority, frequency band, CC index, and so forth. To simplify notation, the CCs may be denoted CC1, CC2, CCN after ordering.

In order to improve the decoding performance of the ACK/NACK states when the ACK/NACK states are for i CCs, i<N, a priority may be set such that the smaller values of i correspond to higher ACK/NACK state priority. In other words, the joint ACK/NACK states corresponding to larger sized $CC_{DTX}$ (a CC set such that the ACK/NACK feedback for the CCs in the CC set is DTX) should correspond to a block code with better decoding performance when deriving the block code from the mother code. In fact, any ACK/NACK state needing high decoding performance has a high priority to map in the former space. An example is shown in Table 11 below.

CC combination is the $s^{th}$ (s is a positive integer, $s \leq C_N^i$) combination in its CC combination group i, and the ACK/NACK feedback for the i-th CCs is $(I_{00}I_{01}I_{10}I_{11} \ldots I_{i,0}I_{i,1})$, then for the ACK/NACK information, the index $I_{joint}$ of the joint ACK/NACK state in decimal notation is expressible as (where the index numbering starts from number zero)

$$I_{joint} = \left( \sum_{j=0}^{i-1} C_N^j 4^j - 1 \right) + (s-1)4^i + (I_{00}I_{01}I_{10}I_{11} \ldots I_{i,0}I_{i,1}) \quad (1)$$

With the index calculated as above, the ACK/NACK information vector representing the joint ACK/NACK states may simply be the binary representation of the index $I_{joint}$.

Denote the k-bit direct binary representation of $I_{joint}$ by $b_0b_1 \ldots b_{k-1}$. The information vector $d_0d_1d_2d_3d_4d_5d_6$, which is the input to the linear encoder, may be simply obtained as

TABLE 11

Exemplary Priority Configuration for various N.

| i: natural number $0 < i \leq N$ the number of CC(s) to which the ACK/NACK feedback is not DTX out of N CCs | CC combination considering DTX state | i: s i is the CC combination group number; s indicates the $s^{th}$ $\{0 < s \leq C_N^i \mid i\}$ CC combination in the CC combination group number i | Number of states in a CC combination group: $4^i$ |
|---|---|---|---|
| 1 | C1 (ACK/NACK feedback to C2, . . . CN is DTX) | 1:1 | 4 |
| 1 | C2 (ACK/NACK feedback to C1, C3, . . . CN is DTX) | 1:2 | 4 |
| . . . |  | 1: s | 4 |
| 1 | CN (ACK/NACK feedback to C1, . . . CN − 1 is DTX) | 1:$C_N^1$ | 4 |
| 2 | C1, C2 (ACK/NACK feedback to C3, . . . CN is DTX) | 2:1 | 16 |
| 2 | C1, C3 (ACK/NACK feedback to C2, C4, . . . CN is DTX) | 2:2 | 16 |
| . . . | . . . | 2: s | 16 |
| 2 | CN − 1, CN (ACK/NACK feedback to C1, C2, . . . CN − 2 is DTX) | 1: $C_N^2$ | 16 |
| . . . | . . . | . . . | $4^i$ |
| N | C1, C2, . . . CN (No DTX occurs) | N:1 | $4^N$ |

Assume the ACK/NACK feedback for multiple CCs is in the same order as an ordering of CCs in the set $CC_{non-DTX}$ (a CC set such that the ACK/NACK feedback to the CCs in the CC set is not DTX), for example, ACK/NACK information for two CC, $CC_{non-DTX}=\{CC\mathbf{1}, CC\mathbf{2}\}$, if (ACK, NACK) is for the CC1, and (ACK, ACK) for CC2, then the ACK/NACK feedback of the two CCs is (ACK, NACK, ACK, ACK).

Assume value 0 corresponds to ACK and value 1 corresponds to NACK, then it is easy to denote a set of ACK/NACK by a set of binary bits of 0 and 1. For example (ACK, NACK, ACK, ACK) may be denoted by set (0100). Although the preceding uses the notation ACK=0 and NACK=1, it is equivalent to use ACK=1 and NACK=0.

Generally, if there are NCCs configured for a UE (i.e., there are N CCs in the configured CC set), in the scenario of ACK/NACK feedback corresponding to i ($0<i \leq N$) CCs, the $d_l=b_{k-l}, 0 \leq l < k$, if $b_0$ is the Most Significant Bit (MSB). The vector $d_0d_1 \ldots d_{k-1}$ may be obtained by $d_l=b_l, 0 \leq l < k$, if $b_0$ is the Least Significant Bit (LSB). If desired, $b_0b_1 \ldots b_{k-1}$ may be converted to the ACK/NACK information vector with bit manipulation. The bit manipulation may be designed to achieve better coding performance, e.g., by mapping joint ACK/NACK states corresponding to larger-size $CC_{DTX}$ (i.e., smaller i in Equation (1)) to a block code with better decoding performance where the block code is expurgated from a mother code by assigning a fixed value to a first set.

Consider a situation with three CCs assigned to a single UE and a priority ordering of the CCs for ACK/NACK feedback purposes may be as follows: C1, C2, and C3, with the priority ordering of the CCs known by both the UE and the eNB. The order of the ACK/NACK feedback is shown in Table 12.

TABLE 12

Exemplary Ordering of ACK/NACK Feedback.

| i: positive integer $0 < i \le 3$ the number of CC(s) to which the ACK/NACK feedback is not DTX out of 3 CCs | CC combination considering DTX state | i: s i is the CC combination group number; the $s^{th}$ CC combination in the CC combination group number i | Number of states in a CC combination group: $4^i$ |
|---|---|---|---|
| 1 | C1 (DTX to C2, C3) | 1:1 | 4 |
| 1 | C2 (DTX to C1, C3) | 1:2 | 4 |
| 1 | C3 (DTX to C1, C2) | 1:3 | 4 |
| 2 | C1, C2 (DTX to C3) | 2:1 | 16 |
| 2 | C1, C3 (DTX to C2) | 2:2 | 16 |
| 2 | C2, C3 (DTX to C1) | 2:3 | 16 |
| 3 | C1, C2, C3 (no DTX) | 3:1 | 64 |

For example, referencing Table 12, in the scenario with three CCs per UE, and ACK/NACK feedback for one CC, the UE has the ACK/NACK feedback (NACK, ACK) to $CC_{non-DTX} = \{CC3\}$, the s=3 (one of the CC combination in CC combination group 1), then according to the order and number of states in Table 12, the combination number of the ACK/NACK information bits in decimal notation is expressible as (starting from number 0)

$$\left(\sum_{j=0}^{i-1} C_N^j 4^j - 1\right) + (s-1)4^1 + 2(10) = 1 - 1 + 2*4^1 + 2 = 10.$$

Denote the decimal 10 using seven binary bits as $b_0b_1b_2b_3b_4b_5b_6=0001010$ (with $b_0$ being the MSB) or 0101000 (with $b_0$ being the LSB). If $b_0$ is the MSB, $d_0d_1d_2d_3d_4d_5d_6$ may be found by $d_i=b_{k-i}, 0 \le i < 7$, while if $b_0$ is the LSB, $d_0d_1d_2d_3d_4d_5d_6=0101000$ may be found by $d_i=b_i$, $0 \le i < 7$. When using $d_i=b_i, 0 \le i < 7$, the ACK/NACK feedback is concentrated into the first four bits of the ACK/NACK information vector, and the last three bits of the information vector is fixed regardless of the actual ACK/NACK feedback {(ACK, ACK), (ACK, NACK), (NACK, ACK), or (NACK, NACK)} of C3. Thus, it can be viewed as the (n, 7) mother code being expurgated to a (n, 4) block code. The four information bits of the (n, 4) code is located at the beginning of the information vector so that the (n, 4) code has the largest possible $d_{min}$ by properly designing the generator matrix of the mother code.

Similarly, in another scenario with three CCs per UE, ACK/NACK feedback is for i=2 CCs, the UE has the ACK/NACK feedback {ACK, ACK, NACK, NACK} of $CC_{non-DTX}=\{CC2, CC3\}$, then according to the order in the table 12, combination of $CC_{non-DTX}=\{C2, C3\}$ is the s=$3^{rd}$ one in the CC combination group 2, the combination number of ACK/NACK information vector in decimal notation is expressible as (starting from number 0)

$$\left(\sum_{j=0}^{i-1=1} C_N^j 4^j - 1\right) + (s-1)4^2 + 3(0011) =$$

$$1 + C_3^1 * 4^1 - 1 + (3-1)4^2 + 3 = 47.$$

Denote the decimal 47 using seven binary bits as $b_0b_1b_2b_3b_4b_5b_6=0010111$ (with $b_0$ being the MSB) or 11110100 (with $b_0$ being the LSB). If $b_0$ is the MSB, $d_0d_1d_2d_3d_4d_5d_6$ may be found by $d_i=b_{k-i}, 0 \le i < 7$, while if $b_0$ is the LSB, $d_0d_1d_2d_3d_4d_5d_6=11110100$ may be found by $d_i=b_i$, $0 \le i < 7$. When using $d_i=b_i, 0 \le i < 7$, the ACK/NACK feedback is concentrated into the first six bits of the ACK/NACK information vector, the last one bit of the information vector is fixed regardless of the actual ACK/NACK feedback to $CC_{non-DTX}=\{CC2, CC3\}$. Thus it can be viewed as the (n, 7) mother code being expurgated to a (n, 6) block code. The six information bits of the (n, 6) code are located at the beginning of the information vector so that the (n, 6) code has the largest possible $d_{min}$ by properly designing the generator matrix of the mother code.

According to an alternative embodiment, the labeling of the ACK/NACK states based on Table 11 may be as follows:

$$I_{joint} = 4^i \times \text{ceil}\left(\frac{\sum_{j=0}^{i-1} C_N^j 4^j - 1}{4^i}\right) + (s-1)4^i + (I_{00}I_{01}I_{10}I_{11} \ldots I_{i,0}I_{i,1}). \quad (2)$$

The labeling of the ACK/NACK states as shown in Equation (2) has a property that for $CC_{non-DTX}$ set of size i CCs, the ACK/NACK information bits can be viewed as two parts:

A first part indicating CC combination.

A second part indicating the ACK/NACK feedback on each CC within the i CCs.

The ACK/NACK feedback for each CC directly corresponds to a bit. Therefore, the ACK/NACK results from a CRC check may be directly assigned to the ACK/NACK information bits. Since the ACK/NACK feedback of each TB is directly mapped to a bit of the ACK/NACK information vector, it may be simple to indicate the ACK/NACK feedback if a single TB is transmitted on a CC instead of two TBs. For example, it may be defined that the ACK/NACK feedback for one TB maps to the first TB if only one TB is transmitted on a CC.

FIGS. 10a through 10e illustrate possible combinations of ACK/NACK information vectors for one to five CCs, according to the embodiment expressed as Equation (2). In FIGS. 10d, 10e-1, and 10e-2, there are shown boxes representing different combinations of CCs actually used to transmit information, such as boxes 1005 and 1010 in FIG. 10d. Each box may be representative of a different combination of CC ACK/NACK states. For example, boxes 1005 and 1010 are labeled both labeled "ALL A/N COMBS OF THREE CCS". However, box 1005 may correspond to a first possible combination of three CCs (e.g., CC#1=A/N, CC#2=A/N, CC#3=A/N, and CC#4=DTX) and box 1010 may correspond to a second possible combination of three CCs (e.g., CC#1=DTX, CC#2=A/N, CC#3=A/N, and CC#4=A/N). Each such box shown in FIGS. 10d, 10e-1, and 10e-2 is representative of a different and unique combination of CC ACK/NACK states.

According to an alternative embodiment, if there are N active CCs for a UE, then a total of n bits are needed for the ACK/NACK information vector. In a situation where ACK/NACK information vector corresponding to i (0<i≤N) CCs, the CC combination is the s-th combination in its CC combination group, and the ACK/NACK information vector for the i CCs is $(I_{00}I_{01}I_{10}I_{11} \ldots I_{i,0}I_{i,1})$ then for the ACK/NACK information vector, the information bits numbered in decimal notation is $$2^n-1-(I_{00}I_{01}I_{10}I_{11} \ldots I_{i,0}I_{i,1}) \text{ when } i=N, \text{ and}$$

$$2^n - 1 - \left\{ \left( \sum_{j=i+1}^{N} C_N^j 4^j \right) + (C_N^i - s)4^i + (I_{00}I_{01}I_{10}I_{11} \ldots I_{i,0}I_{i,1}) \right\}$$

when i<N.

Obviously, $$\sum_{j=i+1}^{N} C_N^j 4^j \right) + (C_N^i - s)4^i$$

is a multiple of $4^i$, and $I_{00}I_{01}I_{10}I_{11} \ldots I_{i,0}I_{i,1} < 4^i$, so the ACK/NACK information vectors have the property that the there are n−2·i bits to be fixed values, and 2·i bits are varied values to represent the $4^1$ ACK/NACK information vectors. There are two bits per component carrier in the case of two feedbacks to each CC. If there is only one feedback to each CC, the bits of the ACK/NACK information vector can be derived by setting one of bits to be fixed value, for example, the bit corresponding to the ACK/NACK information vector causing less reduction in the minimum distance. The one feedback case happens when one of two TBs is decoded correctly or ACK/NACK bundling is used or the number of TBs has been changed to 1.

In case of single TB on some of the CCs and/or use of spatial bundling. In the scenario of three ACK/NACK states (ACK, NACK, DTX) corresponding to a CC from a UE, for example, single TB on a CC including retransmission or use of spatial bundling, assume there are p (a natural number) CCs out of N CCs needing three states feedback and q (a natural number) CCs out of N CCs needing five states feedback, p+q=N.

One possible method for high performance is: according to the binomial theorem:

$$(1+b)^N = \sum_{i=0}^{N} C_N^i 1^{N-i} b^i,$$

wherein $$C_N^i = \frac{N!}{(N-i)!i!},$$

N is a natural number, and a number of ACK/NACK states is four {(ACK, ACK), (ACK, NACK), (NACK, ACK), (NACK, NACK)} and two {(ACK, NACK)}, so set b=4 and 2, respectively. If p=q=0, N−(p+q)=N, which means ACK/NACK feedback for all the CCs is DTX, nothing will be fed back by the UE, so there is no need to denote this state. Then $$\text{Totalstatenum} = (1+2)^p(1+4)^q - 1$$

$$= \left( \sum_{x=0}^{p} C_N^x 2^x \right) \left( \sum_{y=0}^{q} C_N^y 4^y \right) - 1$$

$$= \sum_{x=0}^{p} \sum_{y=0}^{q} C_N^x 2^x C_N^y 4^y - 1.$$

The index sum of (x+y) denotes the number of CC(s) to which the ACK/NACK feedback is not DTX out of N CCs, similarly as the previous examples show: k=⌈$\log_2$ totalstatenum⌉; Total number of states (statenum) means ACK/NACK feedback to {(N−1), (N−2), . . . , (N−i)|i=(x+y), 0<i≤N} CCs is DTX, is equal to a sum of all the coefficients satisfying (x+y)=i; and x≤p, y≤q The information bit vectors can be represented in decimal notation by $$\sum_{0 \leq x+y < i, x \leq p, y \leq q} C_N^x 2^x C_N^y 4^y - 1 + \sum_{x+y=i, x \leq p, y \leq q, c_{i,1}, c_{i,2}, \ldots, c_{i,s-1}} 2^x 4^y + I_{c_{i,s}},$$

where $c_{i,j}$ is the j-th case that the ACK/NACK feedback for each of the i CCs is not DTX, and ACK/NACK feedback to N−i CC is DTX. x and y depend on that how many CCs are with two feedback and how many CC are with 1 feedback for the case $c_{i,j}$.

These embodiments described herein may be sorted by some specified ordering. For example, assume N component carriers, a vector of N elements $(a_0, a_1, \ldots, a_{N-1})$ may be defined, if the ACK/NACK feedback to component carrier j is DTX, then $a_j=0$, otherwise $a_j=1$. Then for each case there will one vector of N elements. There will be a natural ordering to sort the all the vectors of N elements to those cases, for example, by the values in decimal.

$I_{c_{i,s}}$ is the bit of the ACK/NACK information vector that represents the ACK/NACK feedbacks for the i component carriers without DTX. The bit number is $x(c_{i,s})+2y(c_{i,s})$. For x component carriers, each CC has one feedback, hence one bit. For y CCs, each CC has two feedbacks, hence two bits.

The principle of labeling the ACK/NACK states is similar to those said in the embodiment examples, those ACK/NACK states needing high decoding performance have the higher priority to map in the former part. And then the same combination number calculation and permutation method is used.

To maintain the ACK/NACK information vector's property that only $x(c_{i,s})+2y(c_{i,s})$ bits are varied to represent the ACK/NACK states of the case $c_{i,j}$. The following modification mapping of information vector is needed $$2^k \cdot \text{ceil} \left\{ \frac{\sum_{0 \leq x+y < i, x \leq p, y \leq q} C_N^x 2^x C_N^y 4^y - 1 + \sum_{x+y=i, x \leq p, y \leq q, c_{i,1}, c_{i,2}, \ldots, c_{i,s-1}} 2^x 4^y}{2^k} \right\} + I_{c_{i,s}},$$

where k is $x(c_{i,s})+2y(c_{i,s})$.

Another simple method that offers sub-par performance compared to the first one may be described as: Map the set {ACK, NACK} to the set {(ACK, ACK), (ACK, NACK), (NACK, ACK), (NACK, NACK)}, for example, ACK/NACK state ACK is mapped to state (ACK, ACK); ACK/NACK state NACK is mapped to state (NACK, NACK), afterwards, though three ACK/NACK states occur in some CCs, the implementation algorithm is same as five states occurs in all the CCs. Note that the mapping between set {ACK, NACK} and the set {(ACK, ACK), (ACK, NACK), (NACK, ACK), (NACK, NACK)} may have other mapping choices.

In a scenario that ACK/NACK bundling occurs to r CCs (r is a natural number, 0<r≤N), the bundling of ACK/NACK feedback for the CCs may be deemed as ACK/NACK feedback to one CC, the CC can be a CC within the bundling CC group of size r, for example, the CC with the highest priority within the bundling CC group, or the CC can be a new CC by redefining CC order in a reduced CC set of size (N−r+1), or the CC can be a new CC replacing a CC in the CC set by redefining the CC order in a CC set of size N, or so forth. Currently, the CC combination when ACK/NACK bundling occurs among CCs can overlap with those without ACK/NACK bundling among CCs. The principle of labeling the ACK/NACK states is similar to those described in the embodiment examples, those states needing to gain high decoding performance have the higher priority to map in the former part. And then the same combination number calculation and permutation method is used.

Figure 11:
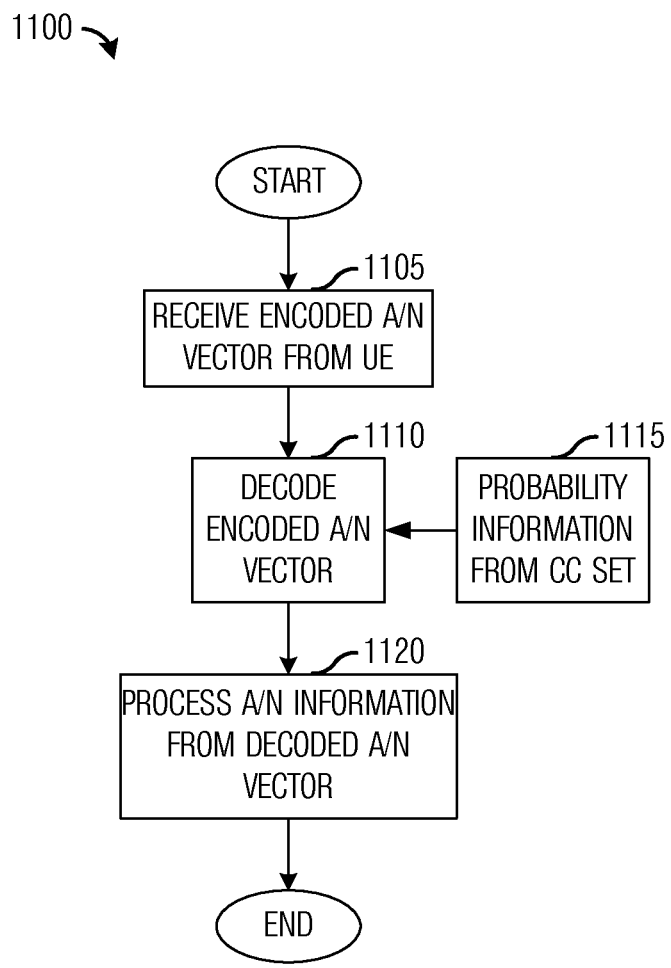
FIG. 11 is a flow diagram of eNB operations in transmitting information based on ACK/NACK information fed back to an eNB by a UE.

FIG. 11 illustrates a flow diagram of eNB operations 1100 in transmitting information based on ACK/NACK information fed back to an eNB by a UE. eNB operations 1100 may be indicative of operations occurring in an eNB as the eNB receives ACK/NACK information fed back to the eNB by a UE, and processes the ACK/NACK information. The ACK/NACK information received from the UE may have been encoded to help improve decoding performance. Additionally, the eNB may make use of a priori information to also help improve decoding performance. The eNB may transmit information to the UE based on the contents of the ACK/NACK information. eNB operations 1100 may occur while the eNB is in a normal operating mode.

eNB operations 1100 may begin with the eNB receiving a transmission from the UE, wherein the transmission includes an encoded ACK/NACK information vector (block 1105). According to an embodiment, the ACK/NACK information vector may be encoded in such a way as to help improve the decoding performance of the eNB. As an example, if the ACK/NACK states fed back to the eNB includes CCs with the ACK/NACK state DTX, then one or more bits in the ACK/NACK information vector may be set to a fixed value prior to encoding.

The eNB may then decode the encoded ACK/NACK information vector (block 1110). In order to help improve decoding performance, the eNB may make use of a priori information based on a configured CC set that it used to transmit information to the UE (block 1115). For example, if the eNB did not use all CCs of the configured CC set to transmit information to the UE, the eNB may make use of information related to unused CCs to help improve decoding performance.

After decoding the encoded ACK/NACK information vector in block 1110, the eNB may process ACK/NACK information contained in the decoded ACK/NACK information vector (block 1120). As an example, if the eNB received a NACK corresponding to a CC wherein the eNB transmitted information to the UE, then an error occurred and the eNB may need to retransmit the information. If the eNB received a NACK corresponding to a CC wherein the eNB did not transmit any information to the UE, then the UE likely determined that the CC had a DTX state. If the eNB received an ACK corresponding to a CC that it used to transmit to the UE, then the UE was able to correctly receive and error check the transmission. eNB operations 1100 may then terminate.

Figure 12:
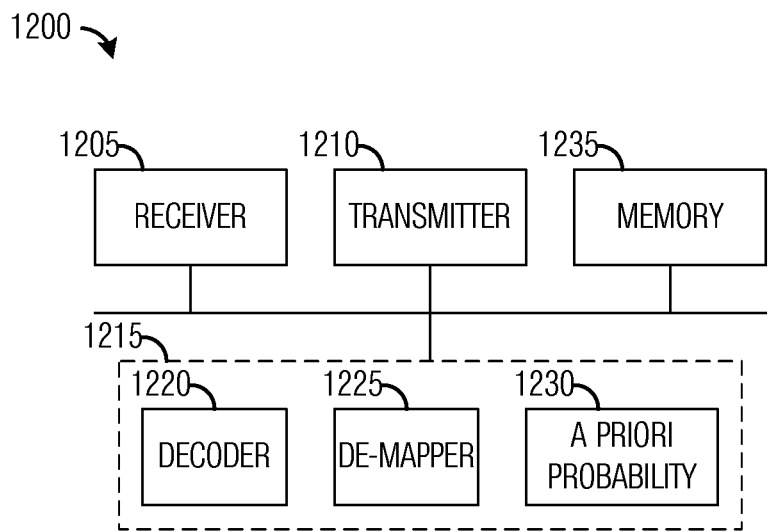
FIG. 12 is a diagram of an alternate illustration of a communications device.

FIG. 12 provides an alternate illustration of a communications device 1200. Communications device 1200 may be an implementation of an eNB. Communications device 1200 may be used to implement various ones of the embodiments discussed herein. As shown in FIG. 12, a receiver 1205 is configured to receive information (such as an encoded ACK/NACK information vector) and a transmitter 1210 is configured to transmit information. A decoder 1220 is configured to decode the ACK/NACK information vector and may make use of a priori information, such as a prior probabilities provided by an a priori probability unit 1230. Decoder 1220 is configured to decode using a linear block code decoder. A de-mapper unit 1225 is configured to apply mapping rules to a decoded ACK/NACK probability vector to produce ACK/NACK states for transmissions made by communications device 1200. A priori probability unit 1230 is configured to compute the a priori probabilities based on a set of CCs allocated for use (i.e., a configured CC set) and actual CCs scheduled for use, which may be a subset of the configured CC set. A memory 1235 is configured to store information, as well as mapping rules, a priori probabilities, configured CC set, actual CCs scheduled, and so on.

The elements of communications device 1200 may be implemented as specific hardware logic blocks. In an alternative, the elements of communications device 1200 may be implemented as software executing in a processor, controller, application specific integrated circuit, or so on. In yet another alternative, the elements of communications device 1200 may be implemented as a combination of software and/or hardware.

As an example, receiver 1205 and transmitter 1210 may be implemented as a specific hardware block, while decoder 1220, de-mapper 1225, and a priori probability unit 1230 may be software modules executing in a microprocessor (such as processor 1215) or a custom circuit or a custom compiled logic array of a field programmable logic array.

Figure 13:
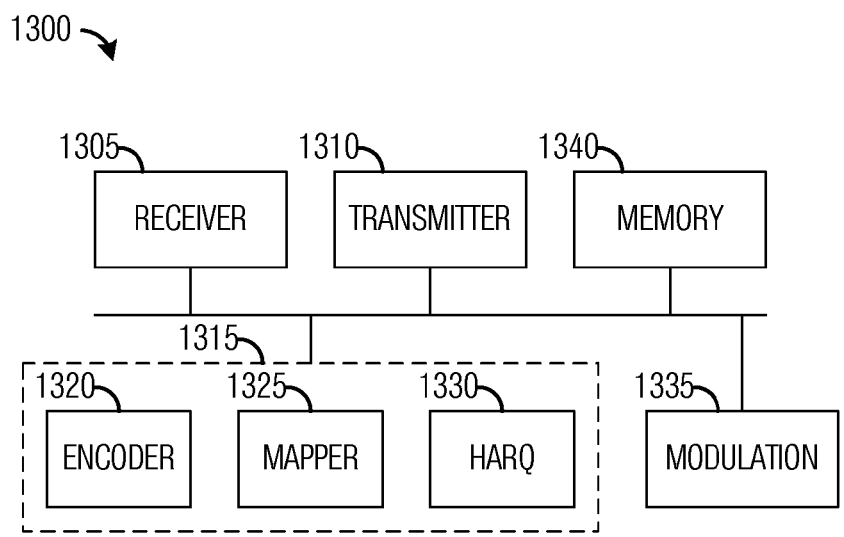
FIG. 13 is a diagram of an alternate illustration of a communications device.

FIG. 13 provides an alternate illustration of a communications device 1300. Communications device 1300 may be an implementation of a UE. Communications device 1300 may be used to implement various ones of the embodiments discussed herein. As shown in FIG. 13, a receiver 1305 is configured to receive information and a transmitter 1310 is configured to transmit information (such as an encoded ACK/NACK information vector). An encoder 1320 is configured to encode the ACK/NACK information vector using a linear block code, for example. Mapper unit 1325 is configured to map individual ACK/NACK states into an ACK/NACK information vector using mapping rules. A HARQ unit 1330 is configured to determine HARQ responses for transmissions received or not received at communications device 1300. A modulation unit 1335 is configured to modulate an encoded ACK/NACK information vector for transmission purposes. A memory 1340 is configured to store information, as well as mapping rules, and so on.

The elements of communications device 1300 may be implemented as specific hardware logic blocks. In an alternative, the elements of communications device 1300 may be implemented as software executing in a processor, controller, application specific integrated circuit, or so on. In yet another alternative, the elements of communications device 1300 may be implemented as a combination of software and/or hardware.

As an example, receiver 1305 and transmitter 1310 may be implemented as a specific hardware block, while encoder 1320, mapper unit 1325, and HARQ unit 1330 may be software modules executing in a microprocessor (such as processor 1315) or a custom circuit or a custom compiled logic array of a field programmable logic array. Similarly, modulation unit 1335 may be implemented as a specific hardware block or a software module in a processor or a custom circuit or a custom compiled logic array of a field programmable logic array.

Advantageous features of embodiments of the invention may include: a device of transmitting the ACK/NACK information, in communication system, comprising scheme of mapping ACK/NACK information states into information bit vector, encoding the information bit vector into codeword by linear block code, is characterized by the mapping have the property of method said above.

Advantageous features of embodiments of the invention may include: a device of receiving the ACK/NACK information, in communication system, comprising module of determining the a prior probability based the scheduling information, decoding the received signal, then de-mapping the decoded information vector into ACK/NACK state, is characterized by the reception method said above.

Advantageous features of embodiments of the invention may include: an ACK/NACK information transmission method and device, the mapping from joint ACK/NACK information states to information bits vectors is characterized by for a subset of ACK/NACK information states of multiple component carriers and/or multiple transmission time intervals that the ACK/NACK feedback to one or more certain component carriers and or multiple transmission time intervals is DTX, the information bits vectors to represent those said subset of joint ACK/NACK information states have fixed values in one or more certain positions.

Advantageous features of embodiments of the invention may include: a method comprising at least one of the positions of bits with fixed values is corresponding to one of the last rows of linear block coding, where removing the said one of the last rows will increase the minimum distance of the expurgated liner block code.

Advantageous features of embodiments of the invention may include: a method comprising at least one of the positions of bits with fixed values is corresponding to one of the last rows of linear block coding, which is not the rows to be applied the FHT.

Advantageous features of embodiments of the invention may include: a method comprising an ACK/NACK information for multiple component carriers that the ACK/NACK feedback of at least M component carriers and/or TTIs is DTX, is mapped to combinations of information bits that some certain bits have the fixed values.

Advantageous features of embodiments of the invention may include: a method comprising a number of bits with fixed values out of the n bits should not be bigger than x (an integer value), where (n−x) bits should be enough to represent the all the ACK/NACK information states that least ACK/NACK feedback of one or more certain component carriers are DTX, where n is a total number of bits to represent the ACK/NACK information states and $2^{(n-x)}$ must be larger than or equal to the number of all the ACK/NACK information states to encode with the DTX property said above.

Advantageous features of embodiments of the invention may include: a method comprising a mapping method for the ACK/NACK information of some component carriers where the ACK/NACK feedback of each component is not DTX. One ACK/NACK feedback is represented by 1 bit.

Advantageous features of embodiments of the invention may include: a mapping method for 1 transport blocks derived from a mapping method for 2 transport blocks by assign the one of two bits to be fixed value.

Advantageous features of embodiments of the invention may include: a method comprising a mapping method to make more zeros in the information bits vectors, where ACK/NACK information with DTX to more component carriers has more zero bits by mapping the ACK/NACK information to the less value in decimal.

Advantageous features of embodiments of the invention may include: a method for transmitting multiple HARQ comprising obtaining the set CCall of the multiple HARQ response groups; obtaining the set $CC_{DTX}$ of HARQ response groups wherein the HARQ responses in set $CC_{DTX}$ is DTX; assigning a first set of bits of an information vector a fixed vector value wherein the fixed vector value is determined by the set $CC_{DTX}$ if $CC_{DTX}$ is a non-empty proper subset of CCall; encoding the information vector; and transmitting the encoded information vector.

The method could further include, wherein the first set of bits corresponding to a smaller $CC_{DTX}$ is a subset of the first set of bits corresponding to a larger $CC_{DTX}$. The method could further include, wherein a second set of bits of the information vector represents the HARQ response of the set $CC_{non-DTX}$ of HARQ groups, the set $CC_{non-DTX}$ is the complement of the set $CC_{DTX}$ such that set $CC_{all}$ is the union of set $CC_{DTX}$ and set $CC_{non-DTX}$, and the information vector is the aggregate of the first set of bits and the second set of bits. The method could further include, wherein the set $CC_{all}$ corresponds to the HARQ response groups of the configured component carrier set. The method could further include, wherein the size of HARQ response group of a component carrier is equal to the expected number of the HARQ response(s) of the component carrier. The method could further include, wherein the first set of bits is further determined by the number of HARQ responses on a component carrier. The method could further include, wherein a single HARQ response is defined for a single transport block transmission on a component carrier. The method could further include, wherein a single HARQ response is defined for multiple transport block transmission on a component carrier. The method could further include, wherein the set $CC_{DTX}$ is the superset of component carriers where no data transmission is scheduled for a transmitter. The method could further include, wherein the receiver receives the encoded information vector; and extracts the HARQ response from encoded information vector using the knowledge that the first set of information bits take the fixed value corresponding to the set $CC_{DTX,0}$, wherein set $CC_{DTX,0}$ is set of component carriers where no data transmission is scheduled for the transmitter.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for communications device operations, the method comprising:
   determining a hybrid automatic repeat request (HARQ) response for each component carrier (CC) in a first set of CCs configured by higher layer signaling, thereby producing a set of HARQ responses;
   generating an information vector from the set of HARQ responses, wherein the information vector comprises a sub-vector composed of one or more bits selected from the information vector and the sub-vector is assigned a fixed vector value if no transmission is detected over at least one CC in a second set of CCs when the second set of CCs is not empty, the second set of CCs being a subset of the first set of CCs, the fixed vector value being independent of HARQ responses for CCs not in the second set of CCs and wherein the generating the information vector is by mapping a set {ACK, NACK} to a set {(ACK, ACK), (ACK, NACK), (NACK, ACK), (NACK, NACK)} in case of a single transport block transmission for a CC;
   encoding the information vector; and
   transmitting the encoded information vector.

2. The method of claim 1, wherein generating an information vector comprises applying a mapping rule based on the first set of configured CCs to the set of HARQ responses.

3. The method of claim 1, wherein the sub-vector with the fixed vector value corresponds to CCs in the second set of CCs.

4. The method of claim 3, wherein remaining bits in the information vector are set to values based on HARQ responses associated with CCs not in the second set of CCs.

5. The method of claim 1, wherein the mapping a set {ACK, NACK} to a set {(ACK, ACK), (ACK, NACK), (NACK, ACK), (NACK, NACK)} in case of a single transport block transmission for a CC comprises mapping a set {ACK, NACK} to a set {(ACK, NACK), (NACK, NACK)}.

6. The method of claim 1, wherein encoding the information vector comprises encoding the information vector with a linear block code.

7. The method of claim 6, wherein the linear block code comprises a Reed-Muller code, a modified Reed-Muller code, a punctured Reed-Muller code, or a combination thereof.

8. The method of claim 1, further comprising detecting an existence of a transmission over each CC in the first set of configured CCs but not in the second set of CCs.

9. The method of claim 8, wherein detecting an existence comprises detecting a control channel.

10. A method for transmitting multiple hybrid automatic repeat request (HARQ) responses, the method comprising:
    determining a first set of component carriers (CCs), wherein the first set of CCs comprises CCs over which no transmission is detected;
    determining a second set of CCs, which does not contain any CC in the first set of CCs;
    assigning a set of bits of an information vector to a fixed vector value, wherein the fixed vector value is according to the first set of CCs;
    assigning remaining bits in the information vector to values according to the second set of CCs;
    encoding the information vector; and
    transmitting the encoded information vector.

11. The method of claim 10, wherein the set of bits of the information vector is used to represent HARQ responses for CCs in the first set of CCs.

12. The method of claim 11, wherein assigning the set of bits of the information vector comprises applying a mapping rule based on the first set of CCs to the HARQ responses.

13. The method of claim 10, wherein the first set of CCs and the second set of CCs belong to a third set of CCs configured by higher layer signaling.

14. The method of claim 10, wherein each bit in the information vector is assigned according to a HARQ response in a CC.

15. The method of claim 14, wherein a HARQ response is defined for one or more transport blocks transmitted over a CC.

16. The method of claim 10, wherein encoding the information vector comprises encoding the information vector with a linear block code.

17. The method of claim 16, wherein the linear block code comprises a Reed-Muller code, a modified Reed-Muller code, a punctured Reed-Muller code, or a combination thereof.

18. The method of claim 10, further comprising detecting an existence of a transmission over each CC in the second set of CCs.

19. The method of claim 18, wherein detecting the existence comprises detecting a control channel.

20. A communications device comprising:
    a response unit configured to determine a hybrid automatic repeat request (HARQ) response for each transport block (TB) of each component carrier (CC) in a first set of CCs configured by higher layer signaling assigned to the communications device;
    a mapper coupled to the response unit, the mapper configured to generate an information vector from HARQ responses produced by the response unit and the first set of CCs, wherein a sub-vector composed of one or more bits selected from the information vector is assigned a fixed vector value if no transmission is detected over at least one CC in a second set of CCs when the second set of CCs is not empty, the second set of CCs being a subset of the first set of CCs, the sub-vector being fixed vector value regardless of HARQ responses for CCs not in the second set of CCs; and
    an encoder coupled to the mapper, the encoder configured to encode the information vector.

21. The communications device of claim 20, wherein the mapper is configured to apply a mapping rule to the HARQ responses produced by the response unit.

22. The communications device of claim 20, wherein the encoder is configured to encode the information vector using a linear block code.

23. The communications device of claim 22, wherein the linear block code comprises a Reed-Muller code, a modified Reed-Muller code, a punctured Reed-Muller code, or a combination thereof.

24. The communications device of claim 20, further comprising a transmitter couple to the encoder, the transmitter configured to transmit the encoded information vector.

25. The communications device of claim 20, wherein the sub-vector with the fixed vector value corresponds to CCs in the second set of CCs.

26. The communications device of claim 20, wherein the mapper is further configured to set remaining bits in the information vector to values based on HARQ responses associated with CCs not in the second set of CCs.

27. The communications device of claim 20, wherein the response unit is further configured to detect an existence of a transmission over each CC in the first set of configured CCs but not in the second set of CCs.

28. The communications device of claim 27, wherein the response unit configured to detect the existence of the transmission comprises the response unit configured to detect a control channel.

* * * * *